(12) United States Patent
Takahashi

(10) Patent No.: US 11,747,737 B2
(45) Date of Patent: Sep. 5, 2023

(54) EXPOSURE APPARATUS, EXPOSURE METHOD, AND METHOD FOR MANUFACTURING SEMICONDUCTOR APPARATUS

(71) Applicant: CANON KABUSHIKI KAISHA, Tokyo (JP)

(72) Inventor: Kazuhiro Takahashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 17 days.

(21) Appl. No.: 17/462,445

(22) Filed: Aug. 31, 2021

(65) Prior Publication Data
US 2022/0066326 A1    Mar. 3, 2022

(30) Foreign Application Priority Data

Sep. 1, 2020    (JP) ................. 2020-147085
Aug. 26, 2021   (JP) ................. 2021-138254

(51) Int. Cl.
*G03F 7/20* (2006.01)
*G03F 7/00* (2006.01)
(Continued)

(52) U.S. Cl.
CPC ..... *G03F 7/70258* (2013.01); *G02B 27/4222* (2013.01); *G03F 7/7055* (2013.01);
(Continued)

(58) Field of Classification Search
CPC ............ G03F 7/70091; G03F 7/70125; G03F 7/70258; G03F 7/70333; G03F 7/7055;
(Continued)

(56) References Cited

U.S. PATENT DOCUMENTS 5,316,896 A    5/1994  Fukuda et al.
5,673,102 A    9/1997  Suzuki et al.
(Continued)

FOREIGN PATENT DOCUMENTS

JP    H07153658 A    6/1995
WO    2019239754 A1  12/2019

OTHER PUBLICATIONS

Office Action issued in Singaporean Appln. No. 10202109490U dated Oct. 28, 2022.
(Continued)

*Primary Examiner* — Peter B Kim
(74) *Attorney, Agent, or Firm* — ROSSI, KIMMS & McDOWELL LLP

(57) ABSTRACT

An exposure apparatus includes an illumination optical system for illuminating an original including a periodic pattern, a projection optical system for forming an image of the original on a substrate, a controller configured to cause light from the illumination optical system to be obliquely incident on the original such that a light intensity distribution which is line-symmetric with respect to a line, passing through an origin of a pupil region of the projection optical system and orthogonal to a periodic direction of the periodic pattern, is formed in the pupil region by diffracted light beams including diffracted light of not lower than 2nd-order from the periodic pattern, and to control exposure of the substrate such that each point in a shot region of the substrate is exposed in not less than two focus states.

21 Claims, 25 Drawing Sheets

(51) Int. Cl.
  *G02B 27/42* (2006.01)
  *H01L 21/265* (2006.01)
  *H01L 21/306* (2006.01)
  *H01L 21/322* (2006.01)

(52) U.S. Cl.
  CPC .. *H01L 21/26506* (2013.01); *H01L 21/30604* (2013.01); *H01L 21/3221* (2013.01)

(58) Field of Classification Search
  CPC ............ G03F 7/70158; G02B 27/0075; G02B 27/4222; H01L 21/26506; H01L 21/30604; H01L 21/3221; H01L 21/76237; H01L 21/14689
  See application file for complete search history.

(56) References Cited

U.S. PATENT DOCUMENTS

| | | | |
|---|---|---|---|
| 6,403,291 | B1 | 6/2002 | Kawashima |
| 2004/0021841 | A1 | 2/2004 | Mori |
| 2004/0196445 | A1* | 10/2004 | Kunkel ............... G03F 7/70141 430/311 |
| 2007/0195295 | A1 | 8/2007 | Fujisawa |
| 2008/0143987 | A1 | 6/2008 | Uemura |
| 2011/0212403 | A1 | 9/2011 | Kuo et al. |
| 2014/0268086 | A1 | 9/2014 | Lu |
| 2015/0293457 | A1 | 10/2015 | Epple |
| 2018/0174839 | A1 | 6/2018 | Lin et al. |
| 2021/0249454 | A1 | 8/2021 | Suzuki |

OTHER PUBLICATIONS

Extended European search report issued in European Appln. No. 21193922.8 dated Jun. 28, 2022.
Partial European Search Report issued in European Appln. No. 21193922.8 dateed Feb. 2, 2022.

* cited by examiner

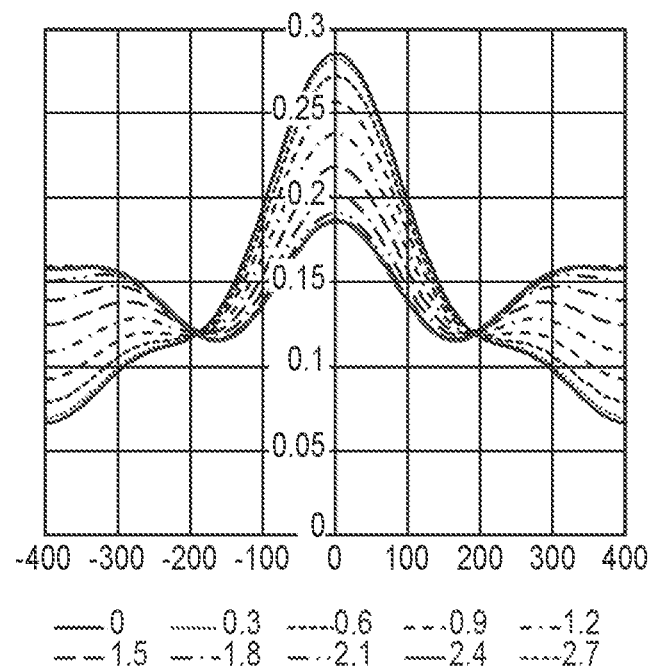
F I G. 11C
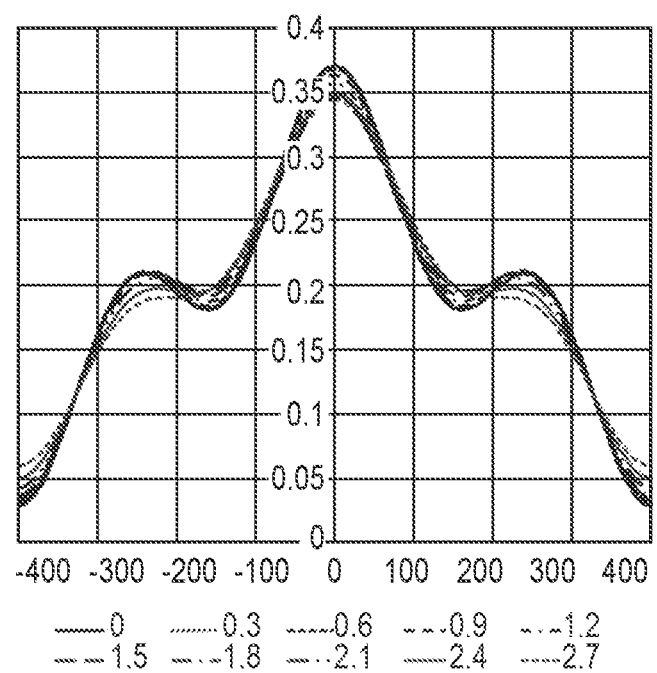
F I G. 12A

F I G. 15
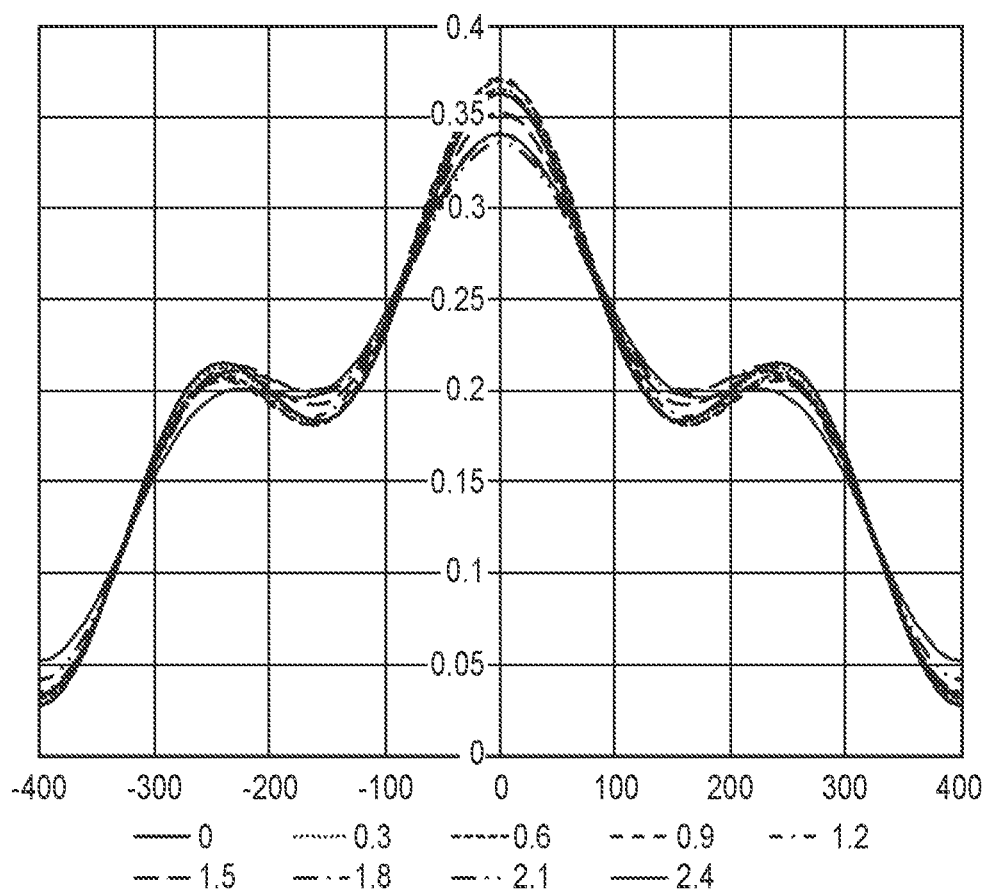

EXPOSURE APPARATUS, EXPOSURE METHOD, AND METHOD FOR MANUFACTURING SEMICONDUCTOR APPARATUS

BACKGROUND OF THE INVENTION

Field of the Invention

The present invention relates to an exposure apparatus, an exposure method, and a method for manufacturing a semiconductor apparatus.

Description of the Related Art

As a method of increasing the depth of focus of an exposure apparatus, a FLEX (Focus Latitude Enhancement Exposure) method is known. The FLEX method can be defined as a method of exposing a substrate in a plurality of defocus states, or a method of exposing a substrate such that the light intensities formed by an original in the vicinity of the image plane of a projection optical system overlap in the optical axis direction. Japanese Patent Laid-Open No. 7-153658 describes an exposure method for satisfactorily resolving an isolated pattern such as a hole pattern or a fine pattern. In this exposure method, multistage exposure is performed in which a substrate is exposed at the in-focus point and each of a plurality of defocus points. For exposure at the in-focus point, the value of the coherency factor ($\sigma$) is set smaller than for exposure at each of the plurality of defocus points.

SUMMARY OF THE INVENTION

The present invention provides a technique advantageous in improving the depth of focus of an exposure apparatus.

One of aspects of the present invention provides an exposure apparatus that comprises an illumination optical system configured to illuminate an original including a periodic pattern and a projection optical system configured to form an image of the original on a substrate. The apparatus comprises a controller configured to cause light from the illumination optical system to be obliquely incident on the original such that a light intensity distribution which is line-symmetric with respect to a straight line, which passes through an origin of a pupil region of the projection optical system and is orthogonal to a periodic direction of the periodic pattern, is formed in the pupil region by a plurality of diffracted light beams including diffracted light of not lower than 2nd-order from the periodic pattern, and to control exposure of the substrate such that each point in a shot region of the substrate is exposed in not less than two focus states.

Further features of the present invention will become apparent from the following description of exemplary embodiments with reference to the attached drawings.

BRIEF DESCRIPTION OF THE DRAWINGS

FIGS. 11A to 11C are views each exemplarily showing a relationship between the light intensity distribution in the pupil region of the illumination optical system and the light intensity distribution formed in the vicinity of the image plane of the projection optical system;

FIGS. 12A to 12C are views each exemplarily showing a relationship between the light intensity distribution in the pupil region of the illumination optical system and the light intensity distribution formed in the vicinity of the image plane of the projection optical system;

FIG. 15 is a view exemplarily showing the light intensity distribution formed in the vicinity of the image plane of a projection optical system in the exposure apparatus according to the third embodiment;

DESCRIPTION OF THE EMBODIMENTS

Figure 1:
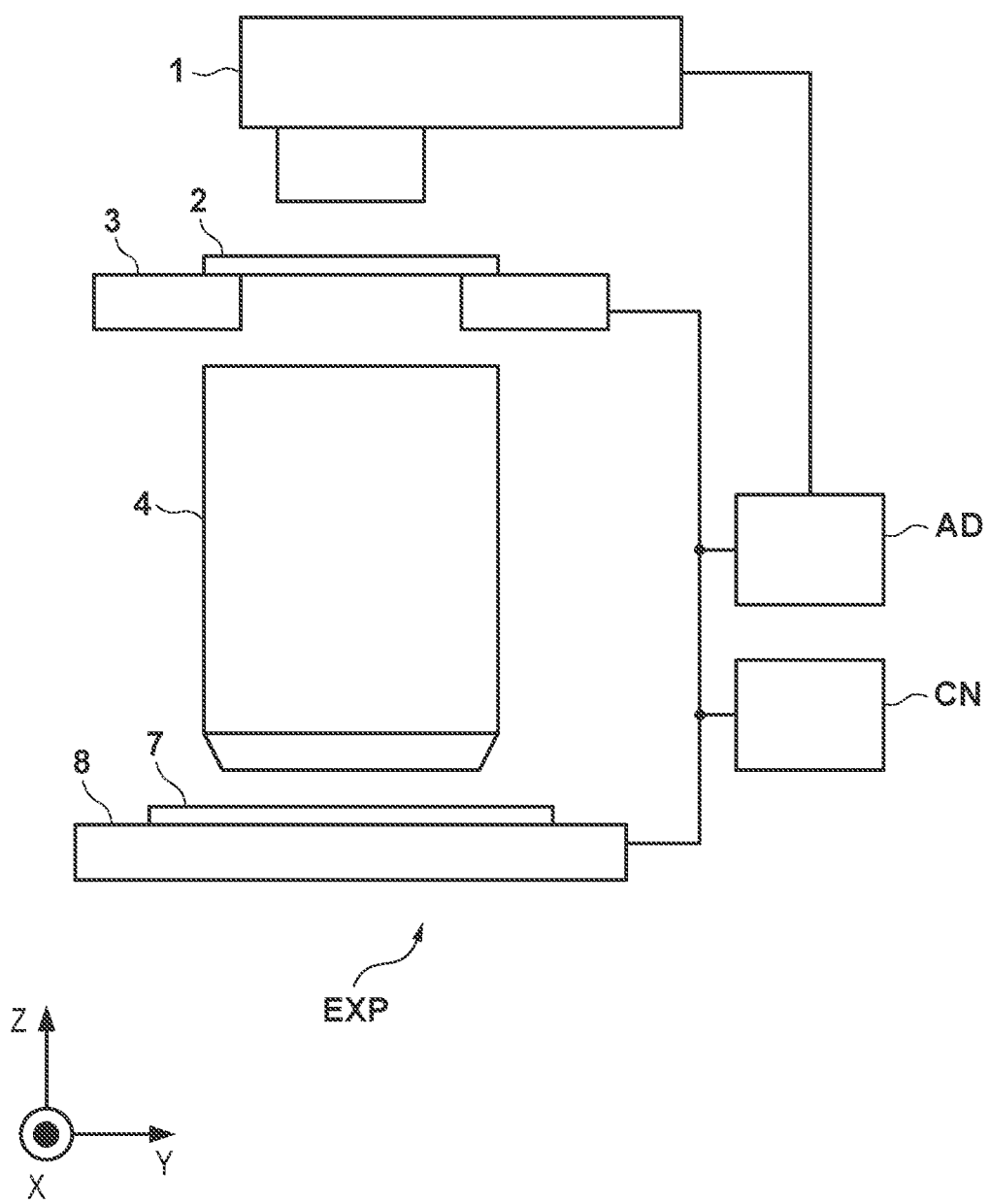
FIG. 1 is a view schematically showing the arrangement of an exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In a following description, directions will be indicated on an XYZ coordinate system. The XYZ coordinate system is defined such that a surface parallel to the surface of a substrate is the X-Y plane, and an axis parallel to the normal direction of the surface of the substrate is the Z-axis. The X direction, the Y direction, and the Z direction are directions parallel to the X-axis, the Y-axis, and the Z-axis of the XYZ coordinate system, respectively.

FIG. 1 schematically shows the arrangement of an exposure apparatus EXP according to the first embodiment. The exposure apparatus EXP is formed as a projection exposure apparatus that exposes a substrate 7 by projecting the pattern of an original 2 onto the substrate 7. Further, the exposure apparatus EXP can be formed as a scanning exposure apparatus that performs scanning exposure on the substrate 7 while scanning the original 2 and the substrate 7. The exposure apparatus EXP can include an illumination optical system 1, an original driving mechanism 3, a projection optical system 4, a substrate driving mechanism 8, an adjuster AD, and a controller CN. The original 2 can include a periodic pattern. The original driving mechanism 3 holds and drives the original 2 in the scanning direction (Y direction). The illumination optical system 1 illuminates the original 2 held by the original driving mechanism 3. The adjuster AD can be configured to be controller by the controller CN. The adjuster AD can be incorporated into the controller CN.

The projection optical system 4 forms, on the substrate 7, the image of the pattern of the original 2 illuminated by the illumination optical system 1. Alternatively, the projection optical system 4 projects, onto the substrate 7, the pattern of the original 2 illuminated by the illumination optical system 1. The pattern of the original 2 illuminated by the illumination optical system 1 generates a plurality of diffracted light beams. The plurality of diffracted light beams from the pattern of the original 2 form the image of the pattern of the original 2 (the light intensity distribution corresponding to the pattern of the original 2) in the vicinity of the image plane of the projection optical system 4. Here, the vicinity of the image plane includes the image plane and the vicinity thereof. The substrate driving mechanism 8 holds and drives the substrate 7 in the scanning direction (Y direction). The substrate driving mechanism 8 can also drive the substrate 7 in the non-scanning direction (X direction).

The substrate 7 can include a plurality of shot regions. The shot region may include a pattern (layer) already formed in a lithography step, or may not include such a pattern (layer). The substrate 7 includes a photoresist layer on a member (for example, a wafer) formed of a semiconductor or a non-semiconductor, unless otherwise mentioned. One or a plurality of layers may be arranged between the member and the photoresist layer.

The illumination optical system 1 includes a pupil region. The pupil region of the illumination optical system 1 is a region, out of the pupil plane of the illumination optical system 1, where light from a light source (not shown) can enter. The projection optical system 4 includes a pupil region. The pupil region of the projection optical system 4 is a region, out of the pupil plane of the projection optical system 4, where light from the illumination optical system 1 can enter. Letting σ be the coherence factor of the exposure apparatus EXP, NA1 be the numerical aperture of the illumination optical system 1 when viewed from the original 2, and NA2 be the numerical aperture of the projection optical system 4 when viewed from the original 2, σ is defined by:

$$\sigma = NA1/NA2$$

The adjuster AD, or the controller CN can adjust the illumination optical system 1 such that the plurality of diffracted light beams from the periodic pattern of the original 2 form, in the pupil region of the projection optical system 4, the light intensity distribution including at least two high light intensity portions. Here, the plurality of diffracted light beams include the 2nd- or higher-order diffracted light. Here, the high light intensity portion means a portion where the light intensity is higher than in a remaining portion (a portion other than the high light intensity portion) in the light intensity distribution. The shape of the high light intensity portion is not limited to a specific shape such as a circular shape, and may be, for example, a rectangular shape. The high light intensity portion can be a region which is wholly surrounded by a region where the light intensity is lower than in the high light intensity portion, or a region which is wholly surrounded by a region where the light intensity is lower than in the high light intensity portion and the boundary of the pupil region. Further, the at least two high light intensity portions are arranged line-symmetrically with respect to a line (straight line) parallel to a direction orthogonal to the periodic direction of the periodic pattern. The adjuster AD can adjust the illumination optical system 1 in accordance with, for example, the information of the periodic pattern of the original 2 such that the light intensity distribution, that includes at least two high light intensity portions arranged line-symmetrically with respect to the line parallel to the direction orthogonal to the periodic direction of the periodic pattern, is formed in the pupil region of the projection optical system 4. The information of the periodic pattern of the original 2 can include, for example, information such as the pitch of the periodic pattern and the periodic direction of the periodic pattern.

In another viewpoint, the adjuster AD, or the controller CN can be configured to cause light from the illumination optical system 1 to be obliquely incident on the original 2 such that a predetermined light intensity distribution is formed in the pupil region by a plurality of diffracted light beams including diffracted light of not lower than 2nd-order from the periodic pattern of the original 2. The predetermined light intensity distribution can be a light intensity distribution which is line-symmetric with respect to a straight line, which passes through the origin of the pupil region of the projection optical system 4 and is orthogonal to the periodic direction of the periodic pattern of the original 2.

The adjuster AD can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. In the following description, the high light intensity portion is also referred to as a pole. Also in a case in which the term "pole" is used, its shape is not limited to a specific shape such as a circular shape, and may be, for example, a rectangular shape.

For example, in accordance with the information (for example, the pitch of the periodic pattern, the periodic direction of the periodic pattern, and the like) of the periodic pattern of the original 2, the adjuster AD can select one illumination mode from a plurality of illumination modes, and adjust the illumination optical system 1 such that the selected illumination mode is set. The adjuster AD can select the illumination mode corresponding to the information of the periodic pattern of the original 2 with reference to, for example, a preset table. The table can define a correspondence relationship between the information of the periodic pattern of the original 2 and the illumination mode. The illumination mode defines the light intensity distribution to be formed in the pupil region of the illumination optical system 1. The plurality of illumination modes can include, for example, normal illumination (circular illumination), small σ illumination, pole illumination (dipole, quadrupole, and the like), annular illumination, and the like. The setting or the selection of the illumination mode can be performed by, for example, rotating a turret in which a plurality of aperture stops are arranged or rotating a turret in which a plurality of CGHs (Computer-Generated Holograms) are arranged. The adjuster AD may determine the illumination mode based on, for example, a user instruction.

The controller CN can control exposure of the substrate 7 such that each point in the shot region of the substrate 7 is exposed in two or more focus states (or, two or more defocus states). More specifically, the controller CN can control exposure of the substrate 7 such that each point in the shot region of the substrate 7 is exposed in two or more focus states (or, two or more defocus states), in a state that the above mentioned predetermined light intensity distribution is formed in the pupil region of the projection optical system 4. Such the exposure method is referred to as a FLEX method hereinafter. The controller CN can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. All or part of the controller CN may be shared or integrated with all or part of the adjuster AD.

Figure 2:
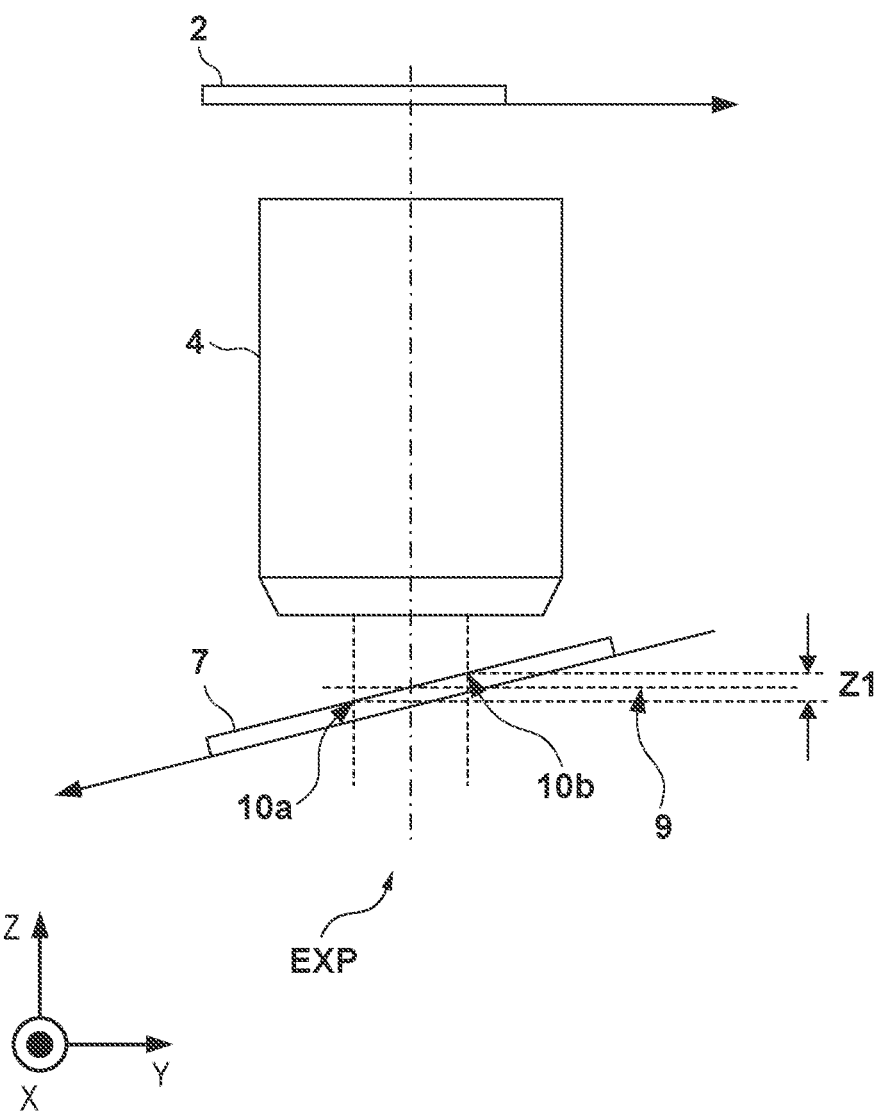
FIG. 2 is a view for explaining FLEX exposure in the exposure apparatus according to the first embodiment.

The FLEX method can be embodied by various embodying methods. In the first embodiment, the controller CN controls exposure of the substrate 7 such that scanning exposure of the substrate 7 is performed in a state in which the normal direction of the surface of the substrate 7 is tilted with respect to the optical axis (parallel to the Z-axis) of the projection optical system 4. FIG. 2 schematically shows the exposure method according to the first embodiment. Dotted lines 10a and 10b indicate the range of exposure light (exposure light defined by the slit) entering the substrate 7. In the scanning exposure, the substrate 7 is scanned in the scanning direction (Y direction) along a plane tilted about the X-axis with respect to the X-Y plane. When one point in the shot region of the substrate 7 moves from the dotted line 10b to the dotted line 10a, the one point is exposed while moving a distance Z1 between the two planes sandwiching a best focus plane 9 of the projection optical system 4.

In other words, in the scanning exposure applied with the FLEX method, an arbitrary point in the shot region of the substrate 7 is exposed so as to reach a second focus state (or, a second defocus state) from a first focus state (or, a first defocus state). The distance Z1 in the optical axis direction of the projection optical system 4 between the position of the arbitrary point in the first focus state (first defocus state) and the position of the arbitrary point in the second focus state (second defocus state) is the range of the defocus amount at the arbitrary point. The distance Z1 is the distance or amount that contributes to increasing the depth of focus by the FLEX method, and this is also referred to as a FLEX amount hereinafter.

In FIG. 2, scanning exposure of the substrate 7 is performed in the state in which the normal direction of the surface of the substrate 7 is tilted with respect to the optical axis direction (parallel to the Z-axis) of the projection optical system 4. However, scanning exposure of the substrate 7 may be performed in a state in which the normal direction of the surface of the original 2 is tilted with respect to the optical axis direction (parallel to the Z-axis) of the projection optical system 4.

Figure 3:
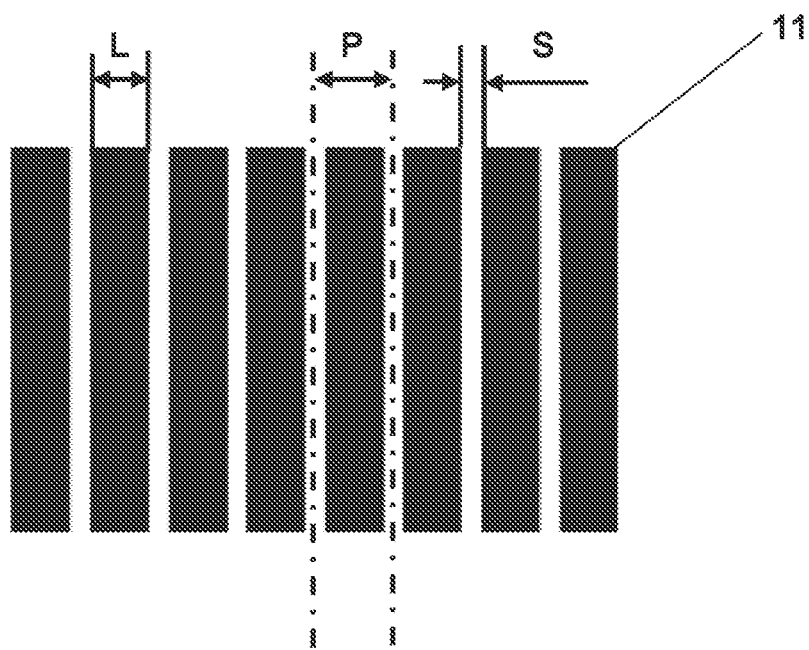
FIG. 3 is a view exemplarily showing a periodic pattern that can be provided in an original.
Figure 3:
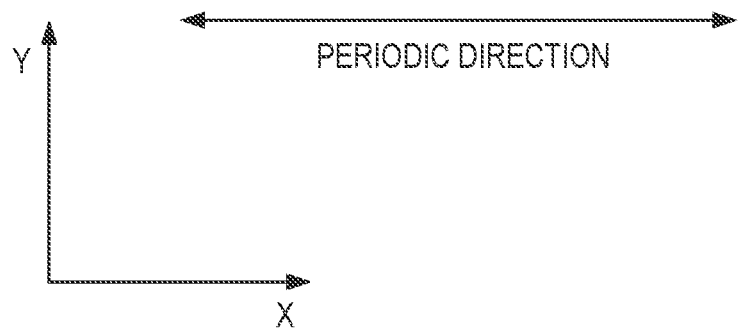

FIG. 3 exemplarily shows a periodic pattern 11 provided in the original 2. P indicates the pitch (period) of the periodic pattern 11, S indicates the line width of a transmissive portion, and L indicates the line width of a light blocking portion. In this example, the periodic direction of the periodic pattern 11 is the X direction.

Figure 4A:
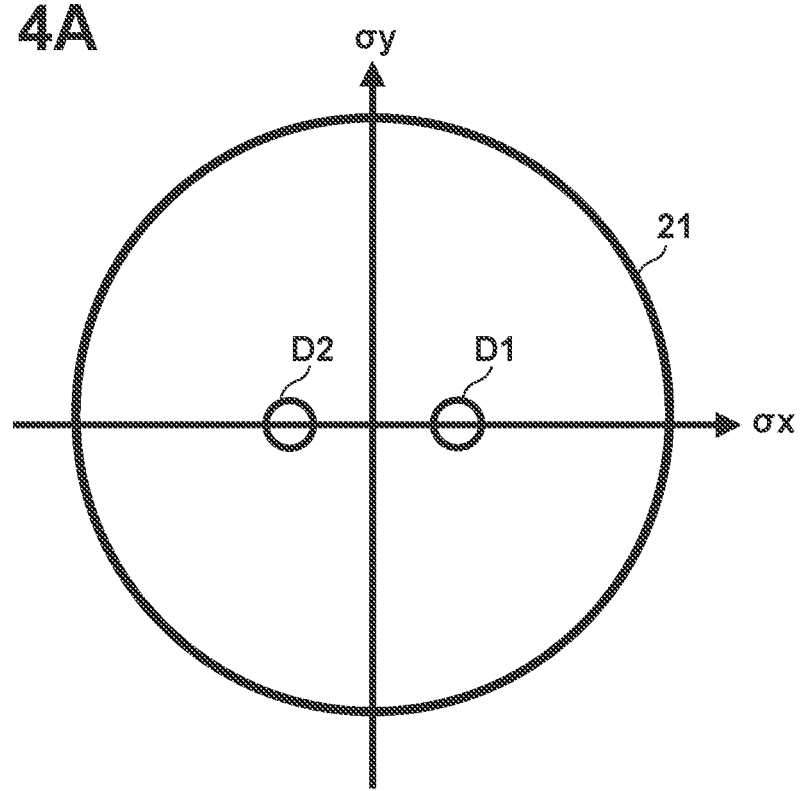
FIG. 4A is a view exemplarily showing the light intensity distribution in the pupil region of an illumination optical system in Example 1.

FIG. 4A schematically shows the light intensity distribution (effective light source distribution) of exposure light in Example 1 in a pupil region 21 of the illumination optical system 1 of the exposure apparatus EXP according to the first embodiment. σx and σy are pupil coordinates which indicate a position in the pupil region 21, and two coordinate axes are parallel to the X-axis and the Y-axis, respectively. The origin of the pupil coordinate matches the optical axis of the illumination optical system 1. FIG. 4A shows an example of dipole illumination, and each of D1 and D2 indicates the pole. The poles D1 and D2 are arranged at positions line-symmetric with respect to the αy-axis (Y-axis).

Figure 4B:
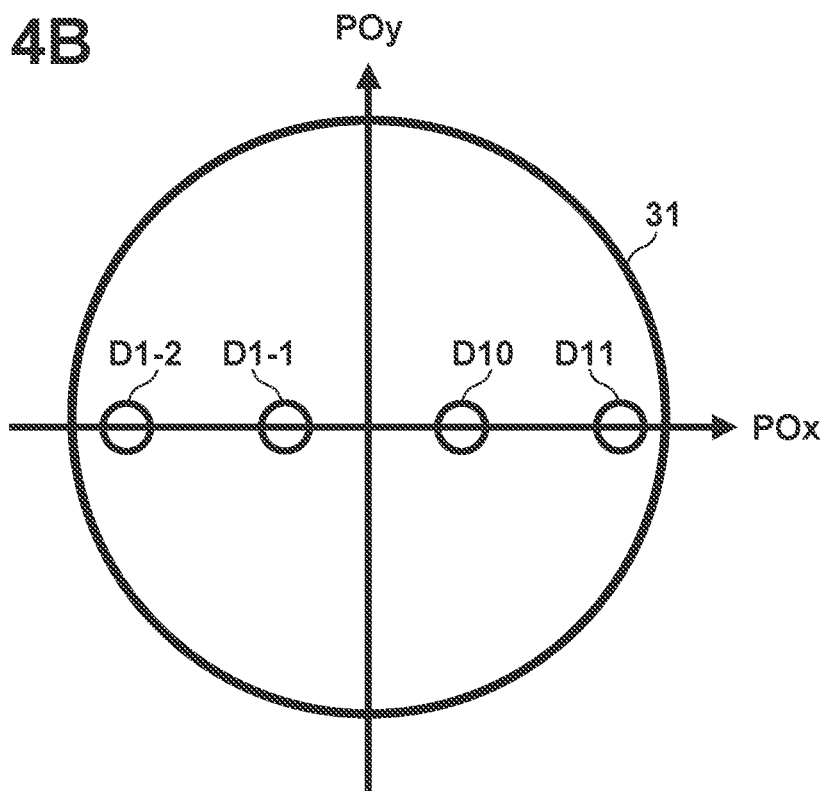
FIG. 4B is a view exemplarily showing the light intensity distribution in the pupil region of a projection optical system.

FIG. 4B schematically shows the light intensity distribution (diffracted light distribution) formed in a pupil region 31 of the projection optical system 4 by the plurality of diffracted light beams from the periodic pattern 11 when the periodic pattern 11 shown in FIG. 3 provided in the original 2 is illuminated with the light intensity distribution shown in FIG. 4A. POx and POy are pupil coordinates which indicate a position in the pupil region 31, and two coordinate axes are parallel to the X-axis and the Y-axis, respectively. The origin of the pupil coordinate matches the optical axis of the projection optical system 4. D10 indicates the 0th-order diffracted light from the pole D1. D11 indicates the +1st-order diffracted light from the pole D1, and D1-1 indicates the −1 st-order diffracted light from the pole D1. D1-2 indicates the −2nd-order diffracted light from the pole D1. In this example, the +2nd-order diffracted light and the 3rd- and higher-order diffracted light beams do not enter the pupil region 31 of the projection optical system 4.

Although not shown in FIG. 4B, diffracted light from the pole D2 also enters the pupil region 31 of the projection optical system 4. More specifically, 0th-order diffracted light D20 from the pole D2 enters the position of D1-1. Further, +1st-order diffracted light D21 from the pole D2 enters the position of D10, and −1st-order diffracted light D2-1 from the pole D2 enters the position of D1-2. Furthermore, +2nd-order diffracted light D22 from the pole D2 enters the position of D11. An image of the periodic pattern 11 is formed on the substrate 7 by the diffracted light beams D10, D11, D1-1, D1-2, D20, D21, D2-1, and D22.

The light intensity distribution formed in the pupil region 31 of the projection optical system 4 includes at least two poles, more specifically, four poles that are arranged line-symmetrically with respect to a line (POy-axis) parallel to a direction (Y direction) orthogonal to the periodic direction of the periodic pattern 11. The positions and regions of the four poles are indicated by D10, D11, D1-1, and D1-2.

Here, a relationship among the pitch P of the periodic pattern 11 shown in FIG. 3, the poles D1 and D2 in the pupil region 21 shown in FIG. 4A, and the diffracted light beams D10, D1-1, D11, and D1-2 in the pupil region 31 shown in FIG. 4B will be described. Let NA be the numerical aperture of the projection optical system 4, and λ be the wavelength of exposure light. First, the coordinates (positions) of the center of each of the poles D1 and D2 shown in FIG. 4A is expressed as:

$$D1: \sigma x = \lambda/(2 \times P \times NA)$$

$$D2: \sigma x = -\lambda/(2 \times P \times NA)$$

Similarly, the coordinate (position) of the center of each of the diffracted light beams D10, D1-1, D11, and D1-2 in the pupil region 31 shown in FIG. 4B is expressed as:

$$D10: POx = \lambda/(2 \times P \times NA)$$

$$D11: POx = 3\lambda/(2 \times P \times NA)$$

$$D1\text{-}1: POx = -\lambda/(2 \times P \times NA)$$

$$D1\text{-}2: POx = -3\lambda/(2 \times P \times NA)$$

For example, if the pitch P of the periodic pattern 11 on the image plane is 800 nm, NA=0.55, and λ=248 nm, σx=0.282.

Figure 5A:
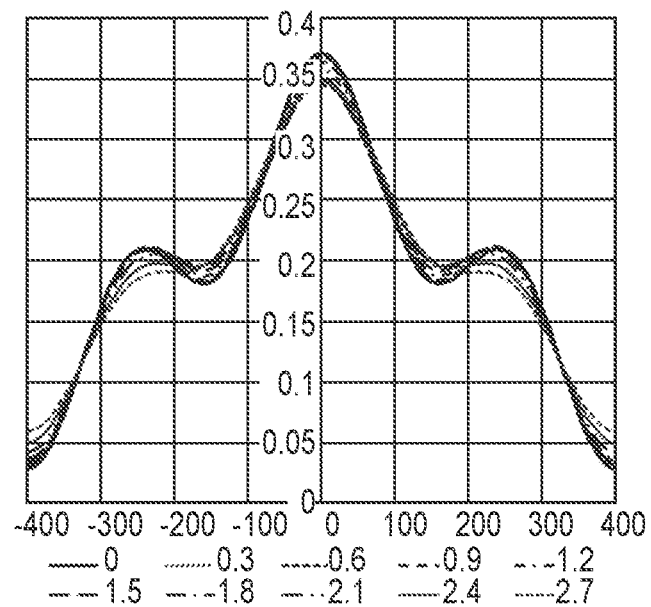
FIGS. 5A to 5C are views each exemplarily showing the light intensity distribution formed in the vicinity of the image plane of the projection optical system.

FIG. 5A shows an optical image obtained when the FLEX exposure as shown in FIG. 2 was performed while setting the line width S of the transmissive portion of the periodic pattern 11 on the image plane to 200 nm and the line width L of the light blocking portion thereof to 600 nm and using the effective light source distribution shown in FIG. 4A. The positions of the centers of the poles D1 and D2 in the effective light source distribution shown in FIG. 4A were set to σ=0.282, and the value obtained by converting the radius of each of the poles D1 and D2 into the σ value was set to 0.05. Further, the amount (FLEX amount) to be defocused in the FLEX method for the position (Z direction) of the set focus plane in the exposure of the substrate 7 was set in a range of ±1.2 μm (Z1=2.4 μm).

The abscissa of FIG. 5A represents the light intensity distribution in a range of ±400 nm corresponding to one period of the pattern while setting the center of the transmissive portion S of the periodic pattern 11 at 0. ±100 nm from the center correspond the transmissive portion S of the periodic pattern 11. The shift amount (defocus amount) of the set focus plane from the best focus plane 9 of the projection optical system 4 was changed from 0 μm to 2.7 μm at 0.3 μm intervals. As can be seen from FIG. 5A, even when the shift amount (defocus amount) of the set focus plane from the best focus plane 9 is set to 2.7 μm, the light intensity distribution hardly changes. Accordingly, it can be seen that the depth of focus is greatly increased.

Figure 5B:
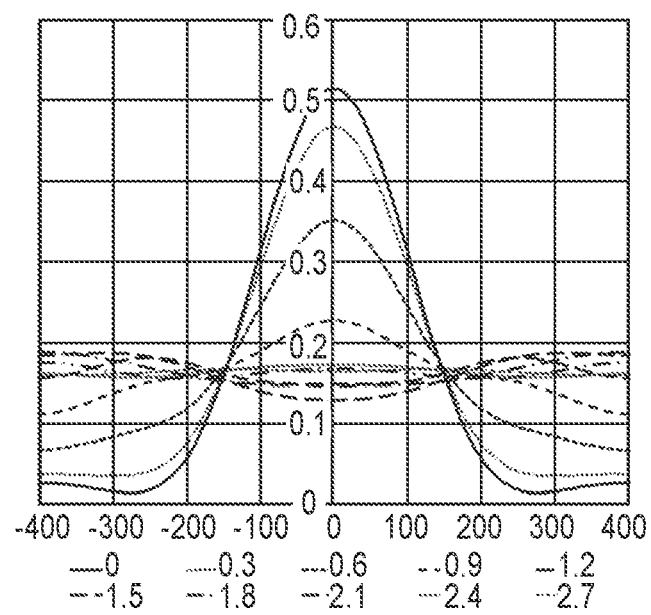
Figure 5C:
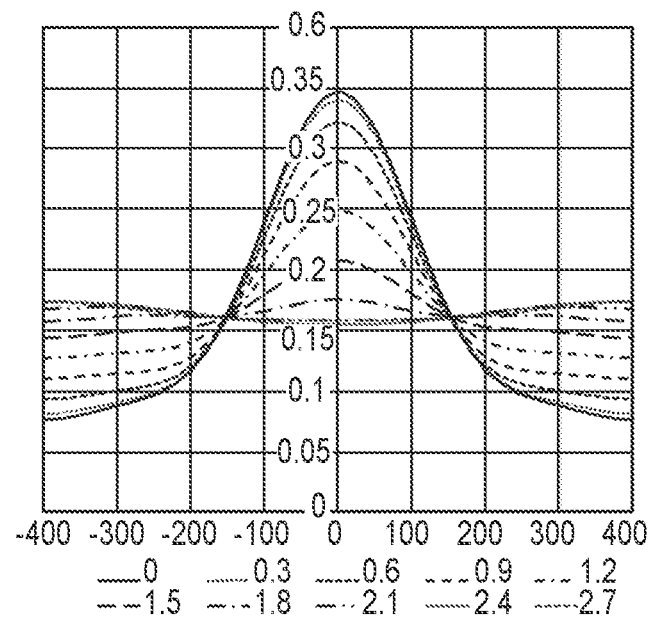

FIGS. 5B and 5C show comparative examples. FIG. 5B shows the result obtained by performing normal scanning exposure using circular illumination with σ=0.7. FIG. 5C shows the result obtained by performing FLEX exposure using circular illumination with σ=0.7 while setting the amount (FLEX amount) to be defocused in the FLEX method for the position (Z direction) of the set focus plane to be in the range of ±1.2 μm (Z1=2.4 μm).

In the comparative example shown in FIG. 5B, under the condition in which the shift amount (defocus amount) of the set focus plane from the best focus plane 9 exceeds 0.9 μm, the light intensity distribution becomes almost flat. Accordingly, the depth of focus is not larger than ±1 μm. In the comparative example shown in FIG. 5C, the light intensity at the best focus decreases due to averaging, but the way the light intensity distribution changes due to defocusing becomes moderate, and the depth of focus can be increased to ±1.2 μm or larger.

Each of FIGS. 5A and 5B shows the result of the FLEX exposure, but it can be seen that the effect of increasing the depth of focus obtained by performing illumination under the illumination condition shown in FIGS. 4A and 4B is enormous. Increasing the depth of focus as described above is advantageous in, for example, a process using a thick-film resist, or the like.

Here, a relationship between the pitch P of the periodic pattern 11, the NA of the projection optical system 4, and the wavelength λ of exposure light will be described. In the example shown in FIGS. 4A and 4B, the plurality of diffracted light beams including the 2nd- or higher-order diffracted light from the periodic pattern 11 form, in the pupil region 31 of the projection optical system 4, the light intensity distribution including at least two poles arranged line-symmetrically with respect to the line parallel to the direction orthogonal to the periodic direction of the periodic pattern 11. Therefore, the positions of D11 and D1-2 on the pupil coordinate need to be located within ±1. In FIG. 4B, since the center of D10 is at (⅓, 0) on the pupil coordinates under the condition in which the POx coordinate of D1-2 becomes −1, the pitch P of the periodic pattern 11 is P=(3/2)×(λ/NA). Accordingly, the pitch P of the periodic pattern 11 needs to satisfy equation (1):

$$P > (3/2) \times (\lambda/NA) \qquad (1)$$

Further, in the example shown in FIGS. 4A and 4B, the adjuster AD adjusts the illumination optical system 1 such that the σ value of the center position of each of the poles D1 and D2 included in the light intensity distribution formed in the pupil region 21 of the illumination optical system 1 is equal to or smaller than ⅓. In another viewpoint, the adjuster AD can be configured to adjust the illumination optical system 1 such that, letting r be the radius of the pupil region 21 of the illumination optical system 1, the center position of each of the poles D1 and D2 included in the light intensity distribution is located in a range of r/3 or less from the origin of the pupil region 21.

Figure 22A:
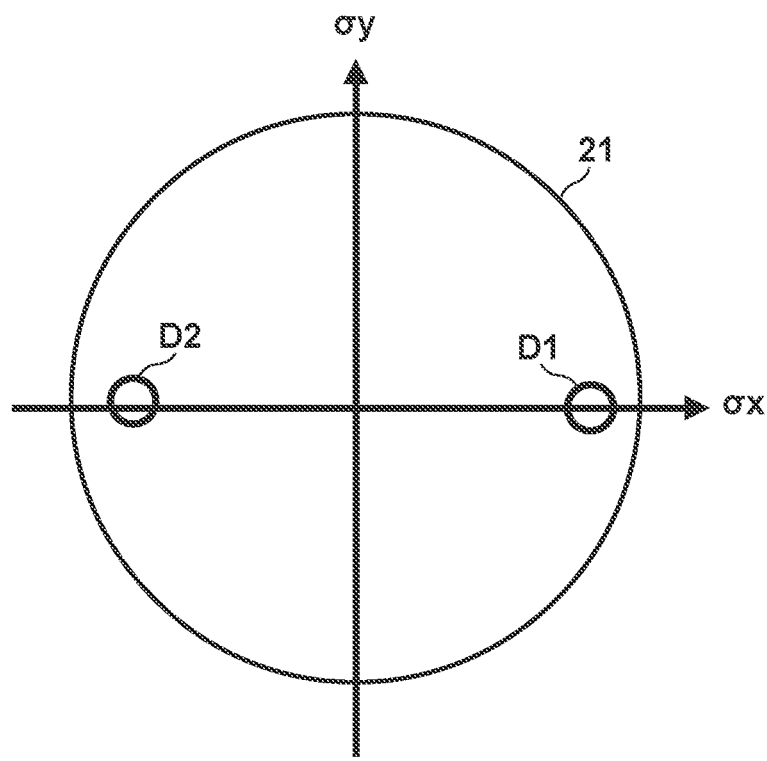
FIG. 22A is a view exemplarily showing the light intensity distribution in the pupil region of the illumination optical system.

FIG. 22A schematically shows another example of the light intensity distribution (effective light source distribution) of exposure light in the pupil region 21 of the illumination optical system 1 of the exposure apparatus EXP according to the first embodiment. σx and σy are pupil coordinates which indicate a position in the pupil region 21, and two coordinate axes are parallel to the X-axis and the Y-axis, respectively. The origin of the pupil coordinate matches the optical axis of the illumination optical system 1. FIG. 22A shows an example of dipole illumination, and each of D1 and D2 indicates the pole. The poles D1 and D2 are arranged at positions line-symmetric with respect to the σy-axis (Y-axis).

Figure 22B:
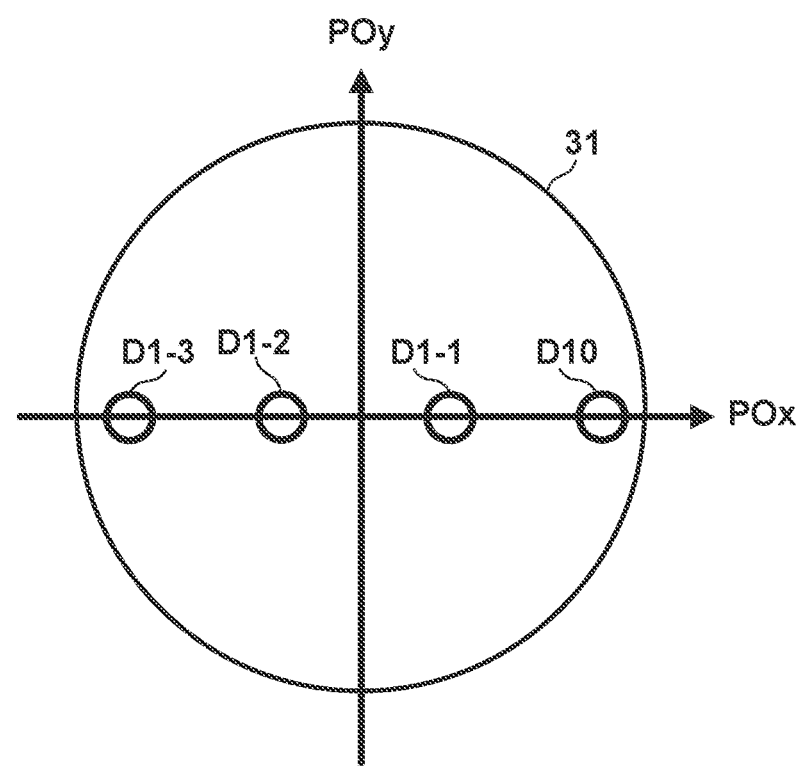
FIG. 22B is a view exemplarily showing the light intensity distribution in the pupil region of the projection optical system.

FIG. 22B schematically shows the light intensity distribution formed in the pupil region 31 of the projection optical system 4 by the plurality of diffracted light beams from the periodic pattern 11 when the periodic pattern 11 shown in FIG. 3 provided in the original 2 is illuminated with the light intensity distribution (dipole illumination) shown in FIG. 22A. POx and POy are pupil coordinates which indicate a position in the pupil region 31, and two coordinate axes are parallel to the X-axis and the Y-axis, respectively. The origin of the pupil coordinate matches the optical axis of the projection optical system 4. D10 indicates the 0th-order diffracted light from the pole D1. D1-1 indicates the −1st-order diffracted light from the pole D1. D1-2 indicates the −2nd-order diffracted light from the pole D1. D1-3 indicates the −3rd-order diffracted light from the pole D1.

Although not shown in FIG. 22B, the diffracted light from the pole D2 also enters the pupil region 31 of the projection optical system 4. More specifically, 0th-order diffracted light D20 from the pole D2 enters the position of D1-3. Further, +1st-order diffracted light D21 from the pole D2 enters the position of D1-2. Furthermore, the +2nd-order diffracted light D22 from the pole D2 enters the position of D1-1. +3rd-order diffracted light D23 from the pole D2 enters the position of D10.

Figure 6A:
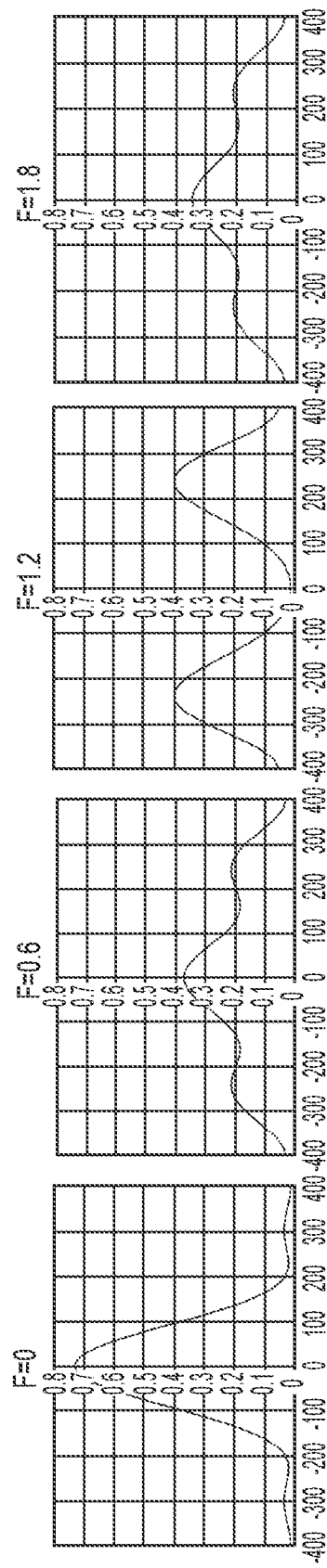
FIGS. 6A and 6B exemplarily show a relationship between the defocus amount and the light intensity distribution in single exposure.
Figure 6B:
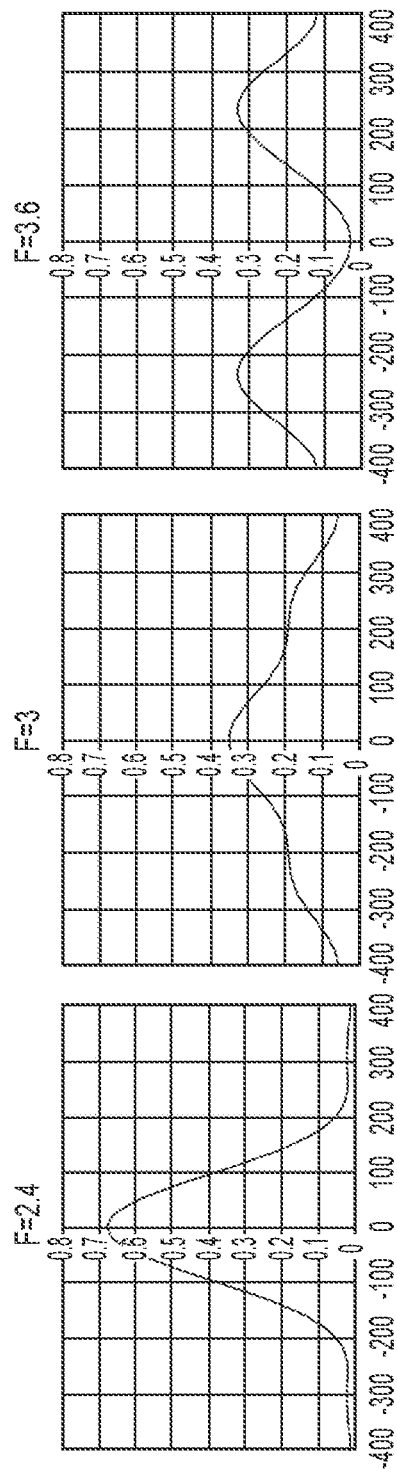

Next, a reason why the depth of focus is increased due to a combination of the illumination condition, in which the plurality of diffracted light beams including the 2nd- or higher-order diffracted light form the line-symmetric light intensity distribution in the pupil region of the projection optical system 4, and the FLEX exposure will be described. FIGS. 6A and 6B show the light intensity distribution formed when not the FLEX exposure but normal exposure is performed using the periodic pattern and the effective light source used in the calculation shown in FIG. 5A. In FIGS. 6A and 6B, the value of F indicates the defocus amount. For example, F=0 shows the light intensity distribution obtained when the defocus amount is 0 (that is, the best focus plane). F=3.6 shows the light intensity distribution obtained when the defocus amount is 3.6 μm. FIGS. 6A and 6B show results obtained by changing the defocus amount by 0.6 μm pitch. The abscissa of each graph in FIGS. 6A and 6B is similar to the abscissa of FIG. 5A, and represents the light intensity distribution in a range of ±400 nm corresponding to one period of the pattern while setting the center of the transmissive portion S of the periodic pattern 11 at 0.

As can be seen from FIGS. 6A and 6B, similar light intensity distributions periodically appear with 2.4 μm as one period. Accordingly, by averaging, in the range of the defocus amount corresponding to an integral multiple of the period, the light intensity distributions that periodically change in accordance with the change of the defocus amount, an optical image in which the light intensity distribution hardly changes due to defocusing as shown in FIG. 5A can be obtained. Here, in the first embodiment, such averaging is implemented by scanning exposure using the FLEX method. In FIGS. 6A and 6B, the light intensity distribution is slightly different between F=0.6 and F=3.0, and also slightly different between F=1.2 and F=3.6. In this manner, two light intensity distributions in the same phase are slightly different from each other. This is because the pole in the effective light source as shown in FIG. 4A is not a point but has a proper radius (for example, 0.05 when converted into the σ value).

Next, a relationship among the pitch P of the periodic pattern 11, the wavelength λ of exposure light, and the optimal defocus amount range (FLEX amount) to perform averaging by the FLEX exposure will be described. As has been described above with reference to FIGS. 6A and 6B, the optical image of the periodic pattern 11 periodically changes in accordance with the defocus amount. Therefore, the period in which the optical image formed by the line-symmetric diffracted light distribution in the pupil range 31 of the projection optical system 4 as shown in FIG. 4B changes in accordance with the change of the defocus amount is calculated.

Since no phase difference is generated, by defocusing, between two diffracted light beams from the line-symmetric positions in the pupil region 31 of the projection optical system 4, the light intensity distribution generated by the two diffracted light beams do not change due to the change of the defocus amount. In the example shown in FIG. 4B, a combination of D10 and D1-1 and a combination of D11 and D1-2 correspond to this condition. On the other hand, each of a combination of D10 and D11 and a combination of D11 and D1-1 is not a combination of line-symmetric positions in the pupil region 31. Thus, a phase difference is generated due to the change of the defocus amount, and the light intensity distribution changes due to the change of the defocus amount. The phase difference between the diffracted light beams changes due to defocusing, and the phase difference becomes zero at a predetermined defocus amount. The interval of the defocus amount at which the phase difference becomes zero is a period PP, and the shape of the light intensity distribution periodically changes due to the change of the defocus amount.

In the example shown in FIG. 4B, D10 and D1-1 are arranged at the line-symmetric positions in the pupil region 31, and D11 and D1-2 are arranged at the line-symmetric positions in the pupil region 31. Accordingly, the phase difference between D10 and D11 may be calculated. Letting $\lambda_{D10}$ and $\lambda_{D11}$ be the wavelength components of D10 and D11 in the optical axis direction, respectively:

$$\lambda_{D10} = \lambda/(1-\lambda^2/P^2/4)^{1/2}$$

$$\lambda_{D11} = \lambda/(1-9\times\lambda^2/P^2/4)^{1/2}$$

Here, the period PP is given by equation (2):

$$PP = \lambda_{D10} \times \lambda_{D11}/(\lambda_{D11}-\lambda_{D10}) = \lambda/[(1-\lambda^2/P^2/4)^{1/2} - (1-9\times\lambda^2/P^2/4)^{1/2}] \quad (2)$$

By substituting P=800 nm and the wavelength λ=248 nm in equation (2), PP=2417 nm is obtained. Thus, as has been described above in FIGS. 6A and 6B, the light intensity distribution changes in the period of the defocus amount=about 2.4 μm. Therefore, by averaging the light intensity distributions in the range of an integral multiple of the period PP defined by equation (2), an image with small change with respect to the change of the defocus amount is formed.

When increasing the depth of focus, by performing FLEX exposure in which the defocus amount is changed in the range (FLEX amount) corresponding to an integral multiple of the period PP calculated from the pitch P of the periodic pattern and the wavelength λ of exposure light according to equation (2), the depth of focus is maximized.

On the other hand, the small distance Z1 (FLEX amount), which is the range of the defocus amount in the FLEX method, is advantageous in simplification of the arrangement of the exposure apparatus EXP. Therefore, the distance Z1 is preferably given by equation (2'):

$$Z1 = \lambda/[(1-\lambda^2/P^2/4)^{1/2} - (1-9\times P^2/4)^{1/2}] \quad (2')$$

The depth of focus is increased even in a case in which the distance Z1 is 70% of that given by equation (2'), so the distance Z1 is not necessarily equal to the period PP.

Figure 7A:
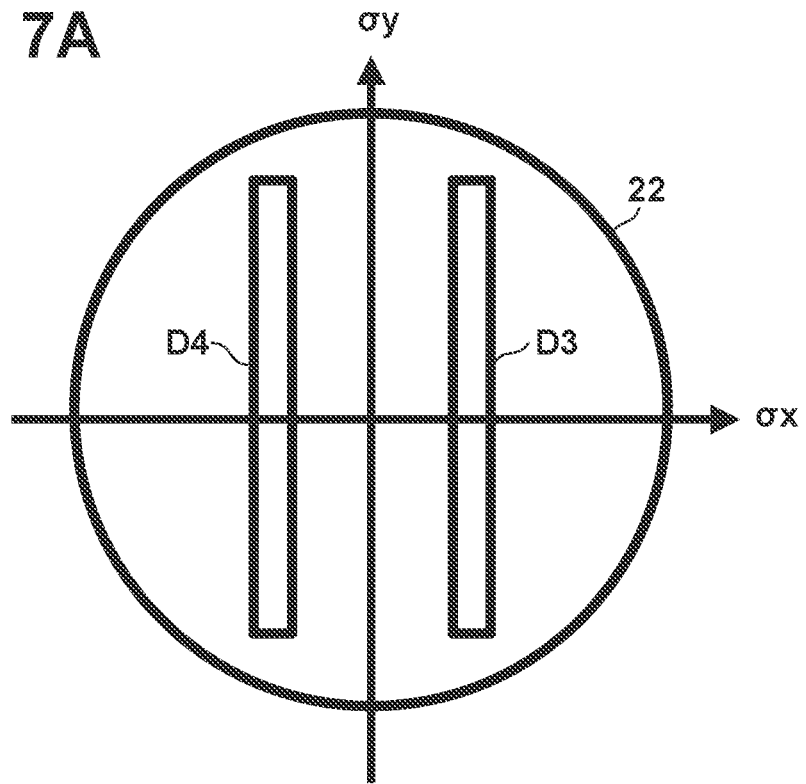
FIG. 7A is a view exemplarily showing the light intensity distribution in the pupil region of the illumination optical system in Example 2.
Figure 7B:
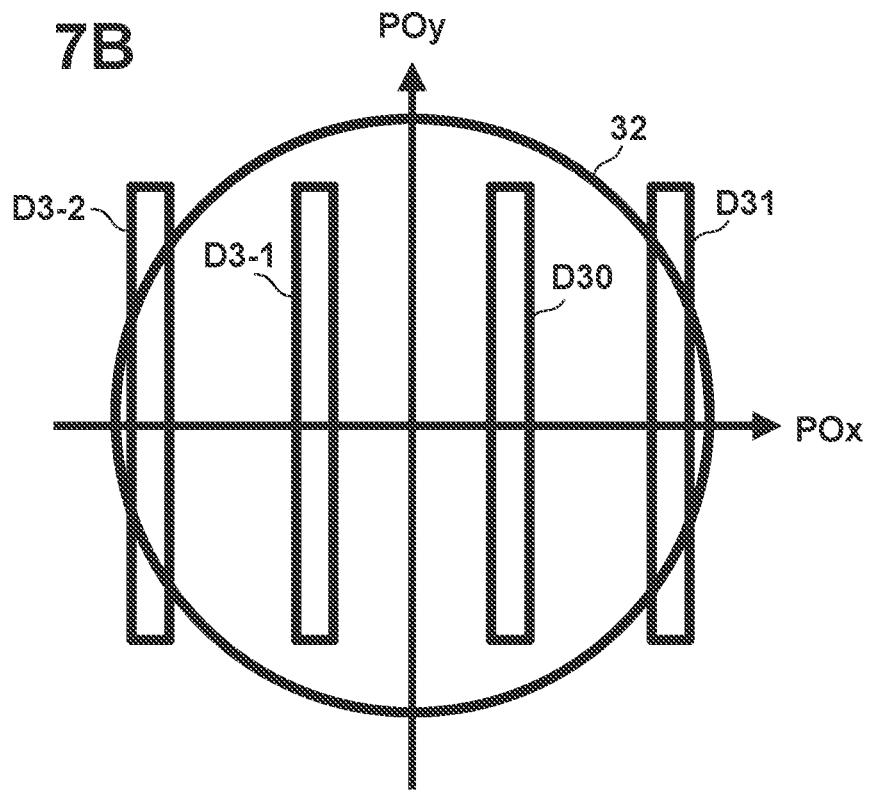
FIG. 7B is a view exemplarily showing the light intensity distribution in the pupil region of the projection optical system in Example 2.

FIG. 7A schematically shows the light intensity distribution (effective light source distribution) of exposure light in Example 2 in a pupil region 22 of the illumination optical system 1 of the exposure apparatus EXP according to the first embodiment. In the example shown in FIG. 7A, rectangular poles D3 and D4 are defined whose widths are set small to obtain the effect of averaging by the FLEX exposure but whose lengths are long in the σy-axis direction because the position in the σy-axis direction does not influence on imaging in the periodic direction. Letting P be the pitch of the periodic pattern 11 shown in FIG. 3, the coordinates in the σx-axis direction at the centers of D3 and D4 are ±λ/(2×P×NA). FIG. 7B schematically shows the light intensity distribution (diffracted light distribution) formed in a pupil region 32 of the projection optical system 4 when the periodic pattern 11 is illuminated with the pole D3 shown in FIG. 7A. Although not shown in FIG. 7B, diffracted light from the pole D4 also enters the pupil region 32 of the projection optical system 4. More specifically, 0th-order diffracted light D40 from the pole D4 enters the position of D3-1. Further, +1st-order diffracted light D41 from the pole D4 enters the position of D30, and −1st-order diffracted light D4-1 from the pole D4 enters the position of D3-2. Furthermore, +2nd-order diffracted light D42 from the pole D4 enters the position of D31. Thus, as in Example 1, the effect of increasing the depth of focus by the FLEX exposure can be obtained.

Example 2 is different from Example 1 in that all the 0th-order diffracted light D30 and all the −1st-order diffracted light D3-1 enter the pupil region 32, but part of the +1st-order diffracted light D31 and part of the −2nd-order diffracted light D3-2 do not enter the pupil region 32 and do not contribute to image forming. Therefore, the light intensity distribution formed in the vicinity of the image plane in Example 2 is different from that in Example 1. However, the effect of increasing the depth of focus by the FLEX exposure in Example 2 is similar to that in Example 1. In Example 2, the area of the pole (effective light source) in the pupil region of the illumination optical system is larger than that in Example 1. This is advantageous in improving the illuminance and improving the illuminance uniformity.

Figure 8:
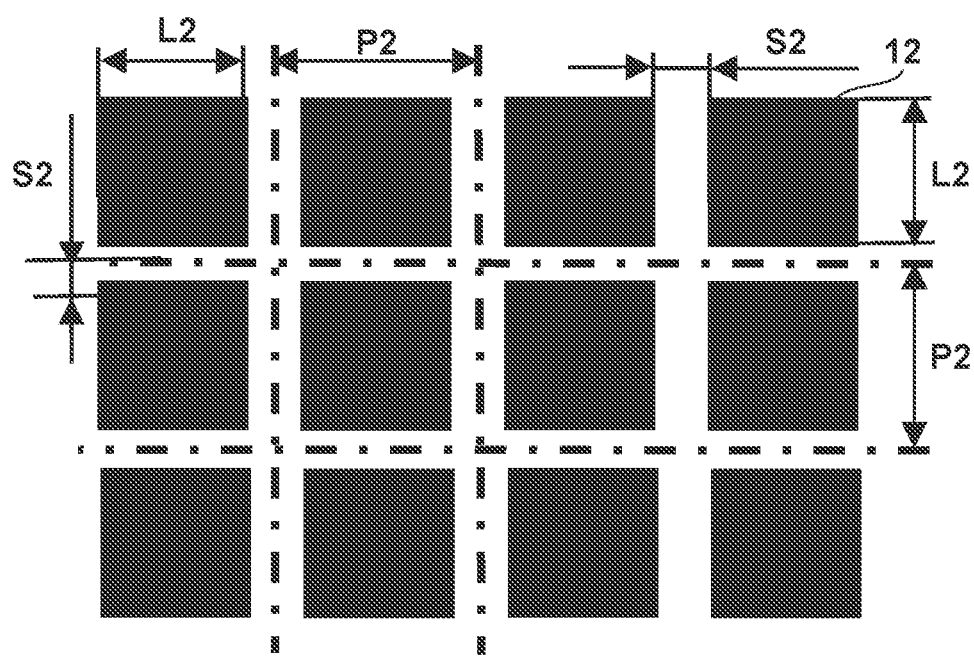
FIG. 8 is a view exemplarily showing a two-dimensional periodic pattern that can be provided in the original.

FIG. 8 shows a periodic pattern 12 to be used in Example 3, which is used in the pupil region 22 of the illumination optical system 1 of the exposure apparatus EXP according to the first embodiment. The original 2 used in Example 3 includes the two-dimensional periodic pattern 12. The two-dimensional periodic pattern 12 has a periodicity of a pitch P2 in the X direction, and also has a periodicity of the pitch P2 in the Y direction.

Figure 9:
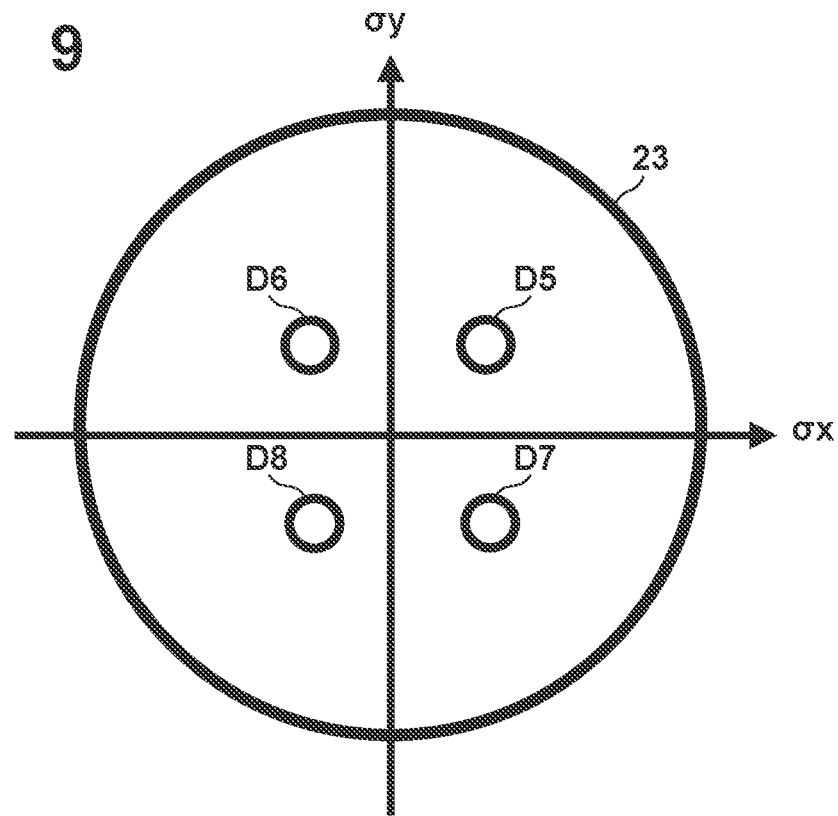
FIG. 9 is a view exemplarily showing the light intensity distribution in the pupil region of the illumination optical system in Example 3.

FIG. 9 schematically shows the light intensity distribution (effective light source distribution) of exposure light in Example 3 in a pupil region 23 of the illumination optical system 1 of the exposure apparatus EXP according to the first embodiment. The light intensity distribution shown in FIG. 9 can be used in substrate exposure using the periodic pattern 12 shown in FIG. 8. When the substrate 7 is exposed using the original 2 including the periodic pattern 12 exemplarily shown in FIG. 8, the adjuster AD can adjust the illumination optical system 1 based on the information of the periodic pattern 12 such that the light intensity distribution exemplarily shown in FIG. 9 is formed in the pupil region 23 of the illumination optical system 1.

The light intensity distribution formed in the pupil region 23 includes poles D5, D6, D7, and D8. The absolute values of σx and σy (σx=σy) at the center of each of the poles D5, D6, D7, and D8 can be λ/(2×P2×NA). The illumination optical system 1 is adjusted such that the light intensity distribution as described above is formed in the pupil region 23, and FLEX exposure can be performed while using, as the FLEX amount, the distance Z1 in the optical axis direction obtained by substituting P2 for P in equation (2). With this, also in a case of using the two-dimensional periodic pattern, the effect of increasing the depth of focus can be obtained as in a case of using the one-dimensional periodic pattern.

Figure 10:
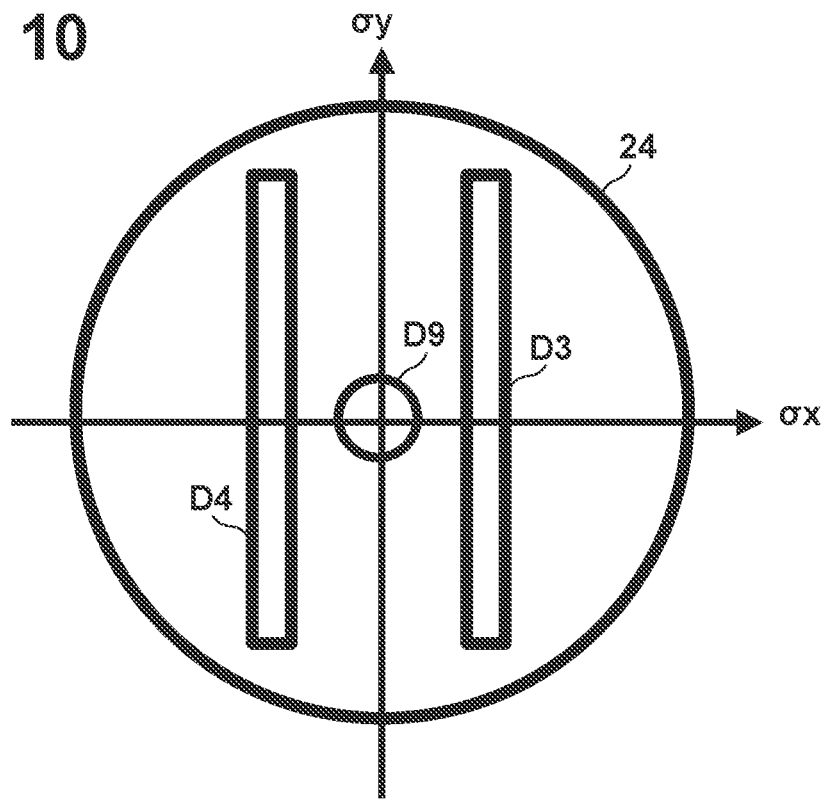
FIG. 10 is a view exemplarily showing the light intensity distribution in the pupil region of the illumination optical system in Example 4.

FIG. 10 schematically shows the light intensity distribution (effective light source distribution) of exposure light in Example 4 in a pupil region 24 of the illumination optical system 1 of the exposure apparatus EXP according to the first embodiment. In Example 4, the light intensity distribution obtained by adding a pole D9 to the light intensity distribution including the poles D3 and D4 in Example 2 is formed in the pupil region 24 of the illumination optical system 1. The poles D3 and D4 are arranged spaced apart from each other and line-symmetrically with respect to the line parallel to the direction orthogonal to the periodic direction of the periodic pattern, and they contribute to increasing the depth of focus. On the other hand, the pole D9 is arranged on the optical axis of the illumination optical system 1. The pole D9 does not contribute to increasing the depth of focus, but can contribute to improving the image quality on the best focus plane and in the vicinity thereof.

Figure 11A:
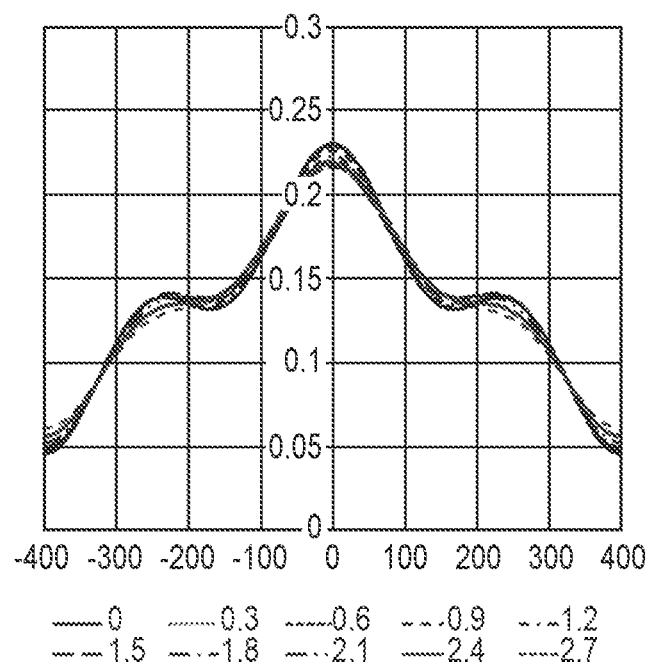
Figure 11B:
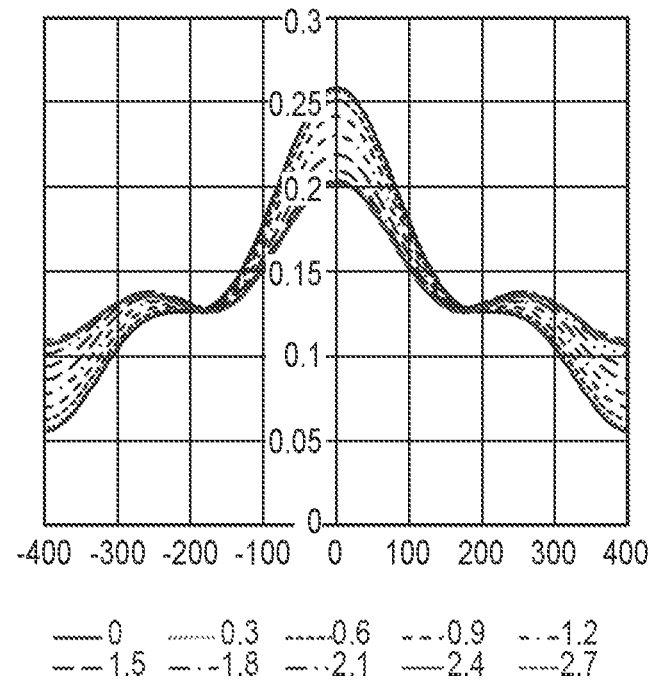

Each of FIGS. 11A to 11C shows a change in light intensity distribution in the vicinity of the image plane obtained when the ratio of the light amount of the pole D9 to the light amount of the entire light intensity distribution in the pupil region 24 of the illumination optical system 1 shown in FIG. 10 is changed. Here, the light intensity distribution in each of FIGS. 11A to 11C was calculated while using the periodic pattern 11 shown in FIG. 3 and setting the line width S of the transmissive portion to 200 nm and the pitch P to 800 nm. FIG. 11A shows an example in which the ratio of the light amount of the pole D9 to the light amount of the entire light intensity distribution in the pupil region 24 is 0, FIG. 11B shows an example in which the ratio is 15%, and FIG. 11C shows an example in which the ratio is 30%. As shown in FIG. 11A, when the ratio of the light amount of the pole D9 is 0, the light intensity distribution formed in the vicinity of the image plane when changing the defocus amount from 0 μm to 2.7 μm hardly changes. On the other hand, as shown in FIG. 11B, when the ratio of the light amount of the pole D9 is set to 15%, the light amount of the central portion in best focus (defocus amount=0 μm) increases, but the image performance changes as the defocus amount is changed. Further, as shown in FIG. 11C, when the ratio of the light amount of the pole D9 is set to 30%, the light amount of the central portion in best focus (defocus amount=0 μm) is further improved, but the change amount in image performance in accordance with the change of the defocus amount further increases.

Here, increasing the light amount of the pole D9 with respect to the light amount of the entire light intensity distribution in the pupil region 24 means decreasing the ratio of the light amounts of the poles D3 and D4 to the light amount of the entire light intensity distribution in the pupil region 24. To the contrary, decreasing the light amount of the pole D9 with respect to the light amount of the entire light intensity distribution in the pupil region 24 means increasing the ratio of the light amounts of the poles D3 and D4 to the light amount of the entire light intensity distribution in the pupil region 24. Increasing the ratio of the light amounts of the poles D3 and D4 to the light amount of the entire light intensity distribution in the pupil region 24 contributes to increasing the depth of focus. On the other hand, decreasing the ratio of the light amounts of the poles D3 and D4 to the light amount of the entire light intensity distribution in the pupil region 24 contributes to improving the image performance in best focus. From the viewpoint of improving the depth of focus, the ratio of the light amounts of the poles D3 and D4 (at least two poles arranged spaced apart from each other and line-symmetrically with respect to the line parallel to the direction orthogonal to the periodic direction) to the light amount of the entire light intensity distribution in the pupil region 24 is preferably equal to or higher than 50%. In the example shown in FIG. 10, the center of the pole D9 matches the optical axis, but the center of the pole D9 may be arranged at, for example, a position on the σy-axis where σy≠0.

Figure 12B:
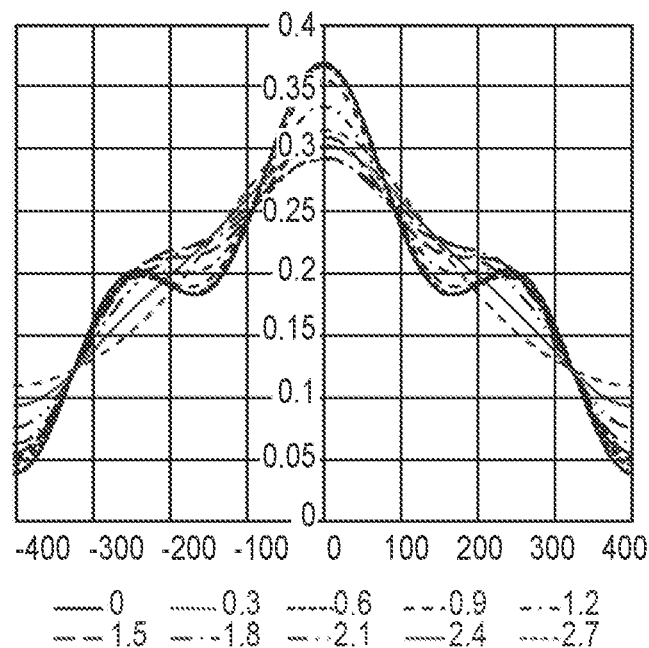
Figure 12C:
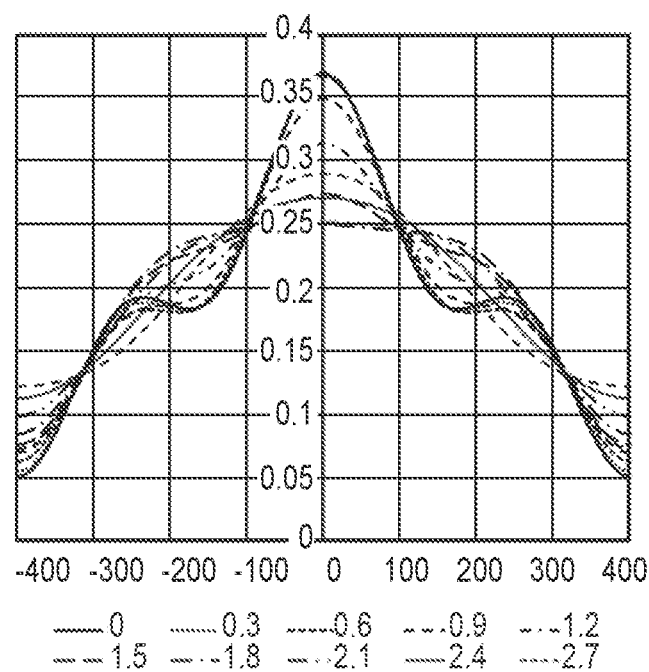

Each of FIGS. 12A to 12C shows a change in light intensity distribution in the vicinity of the image plane obtained when the sizes of the poles D1 and D2 included in the light intensity distribution in the pupil region 21 of the illumination optical system 1 shown in FIG. 4A are changed. Here, the light intensity distribution in each of FIGS. 12A to 12C was calculated while using the periodic pattern 11 shown in FIG. 3 and setting the line width S of the transmissive portion to 200 nm and the pitch P to 800 nm. The shift amount (defocus amount) of the set focus plane from the best focus plane 9 of the projection optical system 4 was changed from 0 μm to 2.7 μm at 0.3 μm intervals. The radius of each of the poles D1 and D2 was set to 0.05, 0.10, or 0.15 in the value (pupil coordinate) converted to the σ value. FIG. 12A shows the result obtained when the radius of each of the poles D1 and D2 is 0.05, FIG. 12B shows the result obtained when the radius of each of the poles D1 and D2 is 0.10, and FIG. 12C shows the result obtained when the radius of each of the poles D1 and D2 is 0.15. Changing the radius of each of the poles D1 and D2 is equivalent to changing the width (diameter) of each of the poles D1 and D2 in the periodic direction of the periodic pattern.

From the viewpoint of increasing the depth of focus, the radius of each of the poles D1 and D2 is preferably small. From the viewpoint of improving the illuminance uniformity on the substrate, the radius of each of the poles D1 and D2 is preferably large. In other words, from the viewpoint of increasing the depth of focus, the width of each of the poles D1 and D2 in the periodic direction of the periodic pattern is preferably small, and from the viewpoint of improving the illuminance uniformity on the substrate, the width of each of the poles D1 and D2 in the periodic direction of the periodic pattern is preferably large. The width of each of the poles D1 and D2 in the periodic direction of the periodic pattern is, for example, preferably equal to or smaller than 0.3 in the value converted into the σ value.

In each of the following embodiments, another embodying method of the FLEX method will be described. Note that matters not mentioned in each of the following embodiments can follow the first embodiment.

Figure 13:
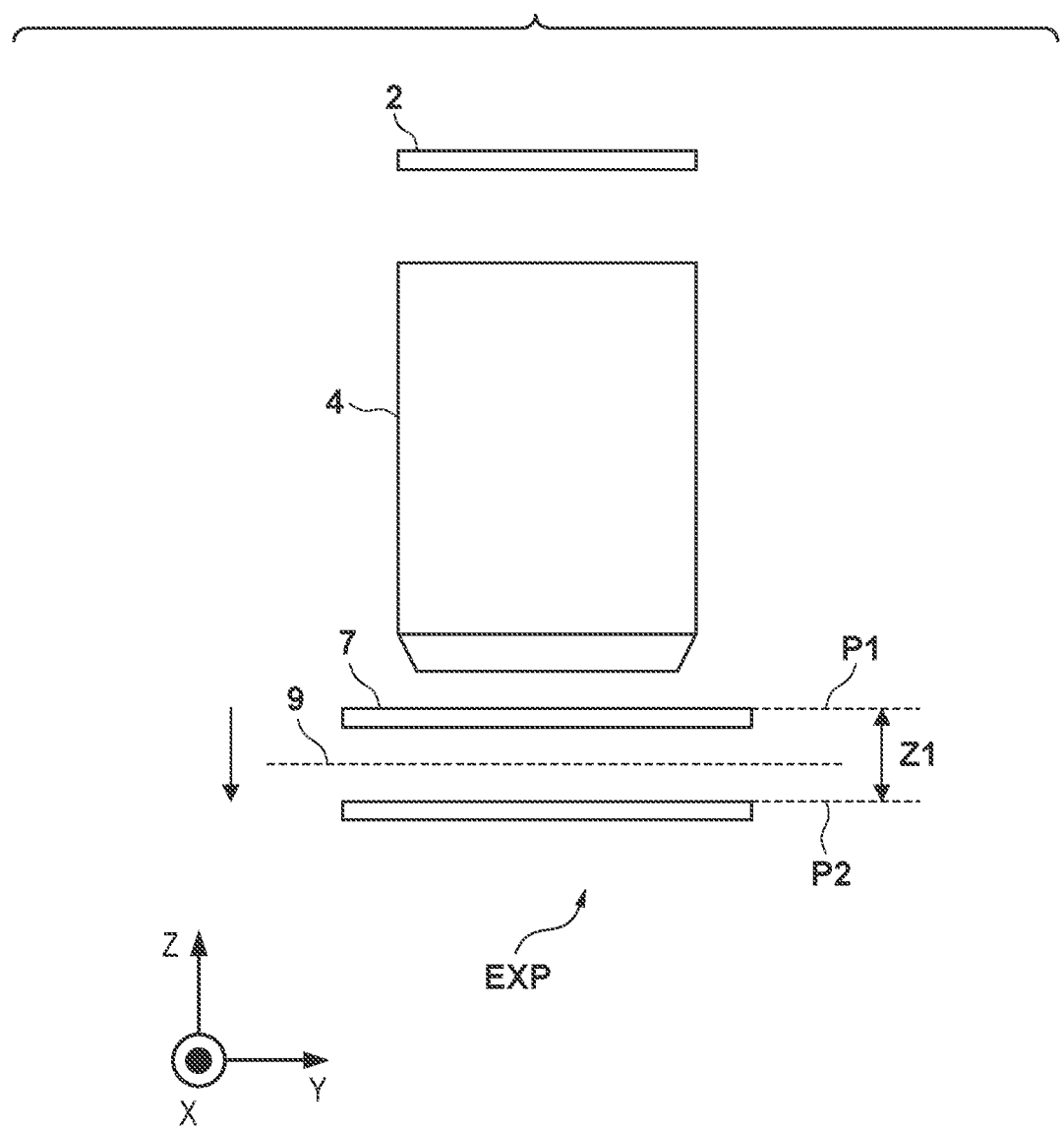
FIG. 13 is a view for explaining FLEX exposure in an exposure apparatus according to the second embodiment.

FIG. 13 shows movement of a substrate during FLEX exposure in an exposure apparatus EXP according to the second embodiment. The exposure apparatus EXP according to the second embodiment can have an arrangement similar to that of the exposure apparatus EXP according to the first embodiment shown in FIG. 1, but the exposure method is different from that in the first embodiment. The exposure apparatus EXP according to the second embodiment shown in FIG. 13 is a step-and-repeat sequential movement exposure apparatus.

In the exposure apparatus EXP according to the second embodiment, exposure of a substrate 7 is performed in a state in which an original 2 and the substrate 7 are stationary. Accordingly, in the exposure apparatus EXP according to the second embodiment, as schematically shown in FIG. 13, FLEX exposure is performed by exposing the substrate 7 while moving the substrate 7 at a constant speed in the range of a distance Z1 from a first position P1 in the Z direction to a second position P2 in the Z direction.

The second embodiment is different from the first embodiment only in the FLEX exposure method of the substrate 7, and the setting of the illumination conditions for increasing the depth of focus and the effect of increasing the depth of focus are exactly the same as in the first embodiment. In the second embodiment, if the pitch P of the periodic pattern of the original is the same as in the first embodiment, the moving amount Z1 of the substrate 7 in the optical axis direction has the same value as in the first embodiment.

Figure 14:
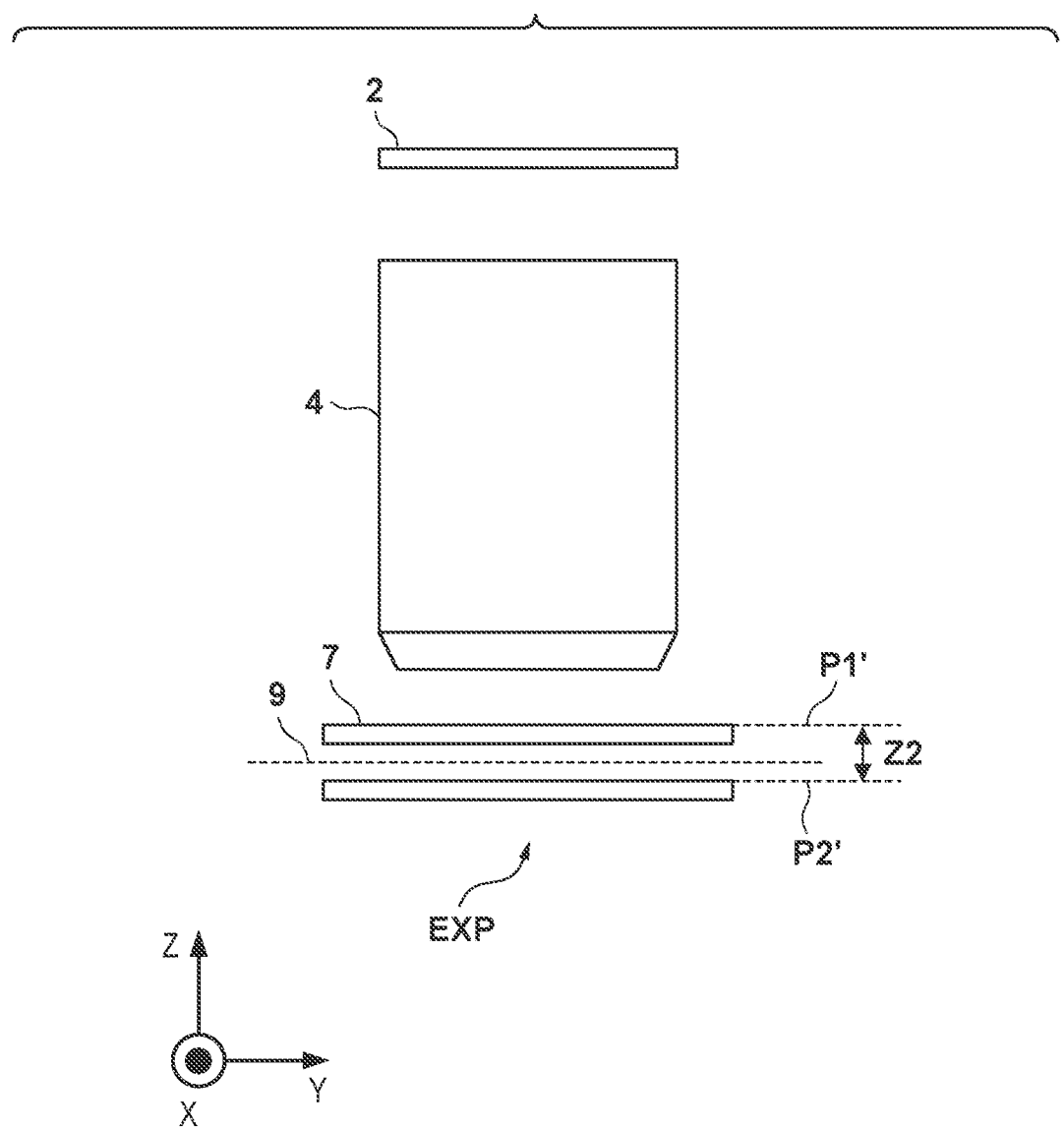
FIG. 14 is a view for explaining FLEX exposure in an exposure apparatus according to the third embodiment.

FIG. 14 shows movement of a substrate during FLEX exposure in an exposure apparatus EXP according to the third embodiment. The movement of the substrate during FLEX exposure in the exposure apparatus EXP according to the third embodiment is similar to the exposure apparatus EXP according to the second embodiment. In the third embodiment, a controller CN controls exposure of a substrate 7 such that a shot region of the substrate 7 is exposed in the first focus state (or, the first defocus state) and the second focus state (or, the second defocus state). In the first focus state (first defocus state), the shot region is exposed with half the normal exposure amount. Then, the first focus state (first defocus state) is changed to the second focus state (second defocus state), and the shot region is further exposed with half the normal exposure amount.

Letting Z2 be the distance (FLEX amount) between a position P1' of the substrate 7 in the first focus state (first defocus state) in the optical axis direction (Z direction) of a projection optical system 4 and a position P2' of the substrate 7 in the second focus state (second defocus state) in the optical axis direction of the projection optical system 4, a relation expressed by Z2=Z1/2 exists. That is, the distance Z2 can be given by equation (3):

$$Z2=\lambda/[(1-\lambda^2/P^2/4)^{1/2}-(1-9\times\lambda^2/P^2/4)^{1/2}]/2 \qquad (3)$$

It will be described below that the depth of focus is increased by the FLEX method performed by the exposure apparatus EXP according to the third embodiment. Here, an example will be described in which the periodic pattern 11 shown in FIG. 3 and the effective light source shown in FIG. 4A are used. When no FLEX exposure is performed, the light intensity distributions shown in FIGS. 6A and 6B as have been already described are formed in the vicinity of the image plane. In the first embodiment, the light intensity distributions shown in FIGS. 6A and 6B are averaged (accumulated) in the width of 2.4 μm in the Z direction (optical axis direction). This is because in the first embodiment, since the FLEX exposure is performed while tilting the substrate 7, the light intensity distributions are averaged in the range of ±1.2 μm with the position of the set focus plane as the center. To the contrary, in the third embodiment, exposure is performed at two Z-direction positions spaced apart by the direction Z2 in the Z direction (optical axis direction). The average of the light intensity distributions that periodically change can be obtained by calculating the average of the light intensity distributions at two Z-direction positions spaced apart by a distance corresponding to half of the period PP. This can obtain the result similar to that obtained by averaging the light intensity distributions in the range corresponding to the entire period.

FIG. 15 shows the light intensity distribution obtained by selecting, from the plurality of light intensity distributions shown in FIGS. 6A and 6B, two light intensity distributions whose defocus amounts are different by 1.2 μm, and averaging the selected two light intensity distributions. For example, the light intensity distribution at the defocus amount=0 μm can be obtained by averaging the light intensity distribution at the defocus amount=−0.6 μm and the light intensity distribution at the defocus amount=+0.6 μm. The light intensity distribution at the defocus amount=6 μm can be obtained by averaging the light intensity distribution at the defocus amount=0 μm and the light intensity distribution at the defocus amount=−1.2 μm. The light intensity distribution shown in FIG. 15 is similar to the light intensity distribution shown in FIG. 5A. Accordingly, it is understood that the effect of increasing the depth of focus can be obtained.

Figure 16:
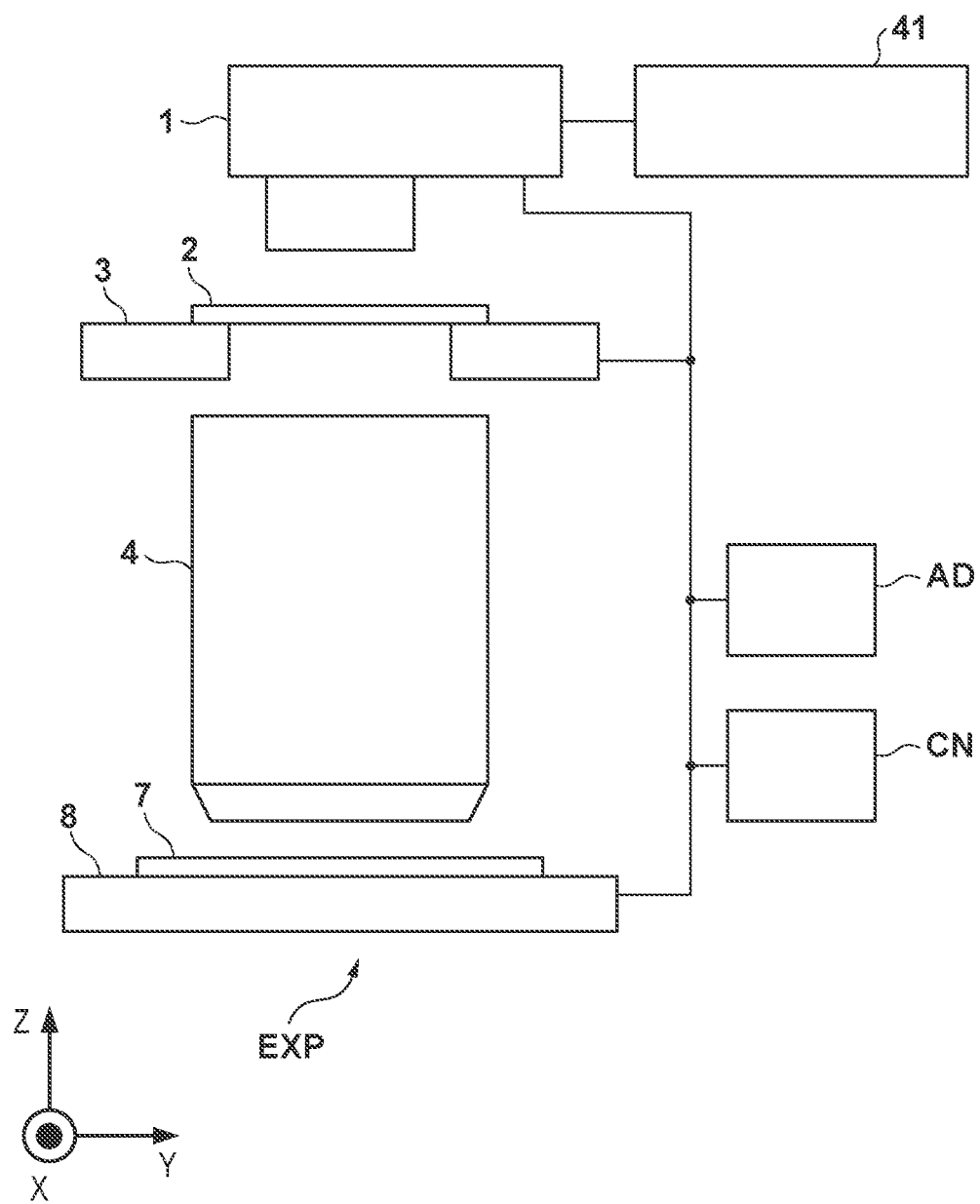
FIG. 16 is a view schematically showing the arrangement of an exposure apparatus according to the fourth embodiment.

FIG. 16 schematically shows the arrangement of an exposure apparatus EXP according to the fourth embodiment. In the fourth embodiment, the defocus amount is changed by changing the center wavelength of exposure light, thereby performing FLEX exposure.

The exposure apparatus EXP according to the fourth embodiment can include a light source 41 that supplies exposure light to an illumination optical system 1. In general, examples of the light source of an exposure apparatus are a mercury lamp using the g-line (436 nm) light or i-line (365 nm) light of mercury, and an excimer laser using KrF (248 nm) light or ArF (193 nm) light. In an exposure apparatus that uses a mercury lamp as a light source, the light source can be arranged inside an illumination optical system in general. In an exposure apparatus that uses an excimer laser as a light source, the light source can be arranged outside an illumination optical system in general.

In the fourth embodiment, since a function of changing the wavelength of exposure light is required, an excimer laser is employed as the light source 41. The half-value width of the emission spectrum of an excimer laser is generally between 100 and 300 nm. However, by arranging a spectrum narrow-band unit in the laser resonator of the light source 41, the band can be narrowed to have the half-value width of 1 μm or less. Further, in order to correct changes in optical characteristics caused by the exposure history of the projection optical system and changes in optical characteristics caused by the atmospheric pressure, the light source 41 also has a function of controlling the center wavelength. A controller CN has a function of controlling the wavelength of exposure light generated by the light source 41.

Figure 17:
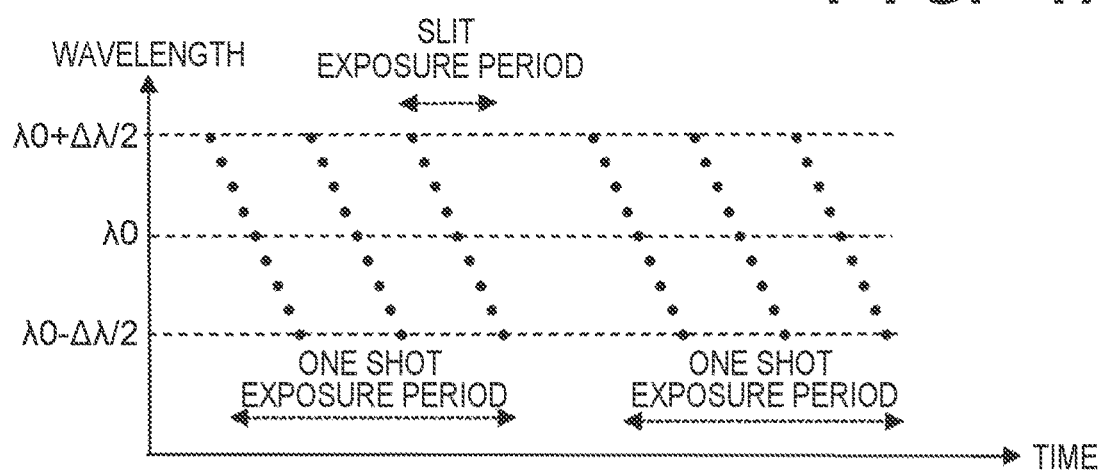
FIG. 17 is a view for explaining an exposure method according to the fourth embodiment.

FIG. 17 exemplarily shows a FLEX exposure method in the exposure apparatus EXP according to the fourth embodiment. In FIG. 17, the abscissa represents time, and the ordinate represents the center wavelength of exposure light generated by the light source 41. "One shot exposure period" is a period in which scanning exposure is performed on one shot region. In a scanning exposure apparatus, a point in a shot region of the substrate 7 is exposed while the point passes through the section between the dotted line 10a and the dotted line 10b shown in FIG. 2. Therefore, it is necessary to change the wavelength from λ0+Δλ/2 to λ0−Δλ/2 in the period in which the point passes through the section. Since the excimer laser serving as the light source 41 is a pulse laser, the center wavelength of exposure light can be changed between the two wavelengths of λ0+Δλ/2 and λ0−Δλ/2 at equal intervals for each pulse. λ0 is the center wavelength of exposure light generated by the light source 41 when no FLEX exposure is performed.

Letting C be the axial chromatic aberration of a projection optical system 4, a change amount Δλ of the center wavelength corresponding to a driving amount Z1 upon driving each point in a shot region of the substrate 7 in the Z direction during FLEX exposure is expressed by Δλ=Z1/C.

Here, letting P be the pitch of a periodic pattern 11, if the depth of focus is increased by averaging, in one period of the wavelength change, changes of the light intensity distribution in accordance with the wavelength changes, equation (4) defining Δλ can be obtained from equation (2'). Here, λ0 is the peak wavelength of exposure light, and λ is approximated by λ0:

$$\Delta\lambda = \lambda 0/[(1-\lambda 0^2/P^2/4)^{1/2} - (1-9\times\lambda 0^2/P^2/4)^{1/2}]/C \qquad 4$$

Figure 18A:
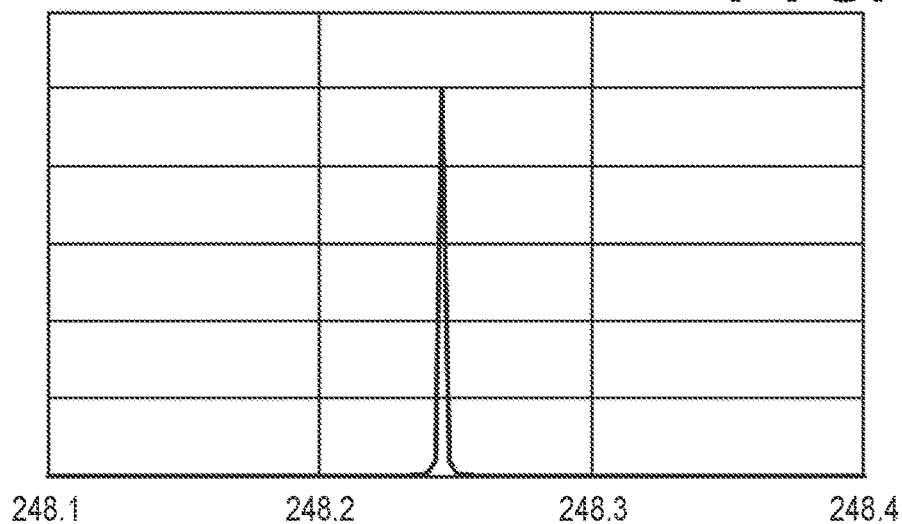
FIGS. 18A and 18B are views for explaining an exposure method according to the fifth embodiment.
Figure 18B:
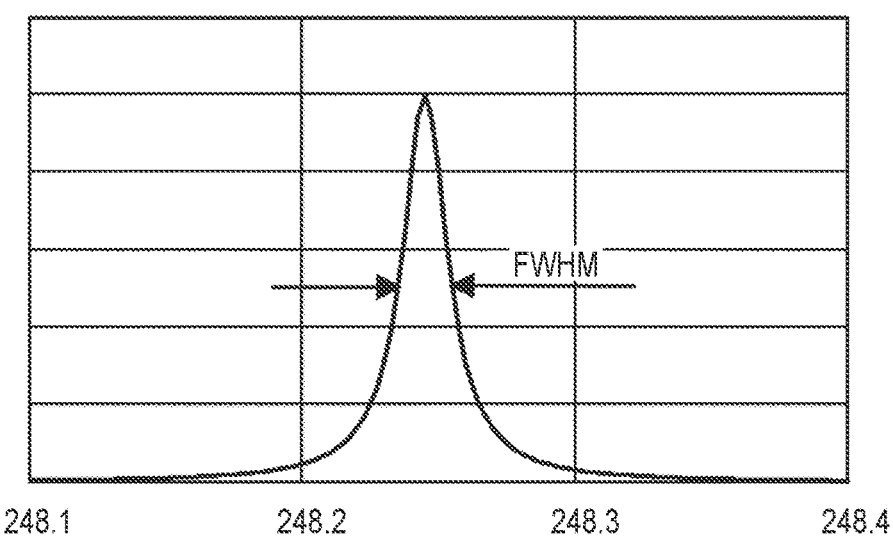

With reference to FIGS. 18A and 18B, FLEX exposure in an exposure apparatus EXP according to the fifth embodiment will be described. The exposure apparatus EXP according to the fifth embodiment can have an arrangement similar to that of the exposure apparatus EXP according to the fourth embodiment shown in FIG. 16. In the fifth embodiment, instead of changing, over time, the center wavelength of exposure light generated by a light source 41, the FWHM (Full Width at Half Maximum) of the emission spectrum of exposure light is increased. FIG. 18A shows the emission spectrum of exposure light generated by the light source 41 when the exposure apparatus EXP according to the fifth embodiment performs normal exposure. FIG. 18B shows an example of the emission spectrum of exposure light generated by the light source 41 when the exposure apparatus EXP according to the fifth embodiment performs FLEX exposure. In each of FIGS. 18A and 18B, the abscissa represents the wavelength, and the ordinate represents the spectrum intensity. In the FLEX exposure, a controller CN controls the light source 41 such that the FWHM of the emission spectrum becomes Δλ. By setting the FWHM of the emission spectrum to the value of Δλ, it is possible to obtain the effect similar to that in the FLEX exposure in the fifth embodiment without changing the wavelength. Δλ is desirably given by equation (4) so as to satisfy the conditions for increasing the depth of focus to maximum.

Figure 19:
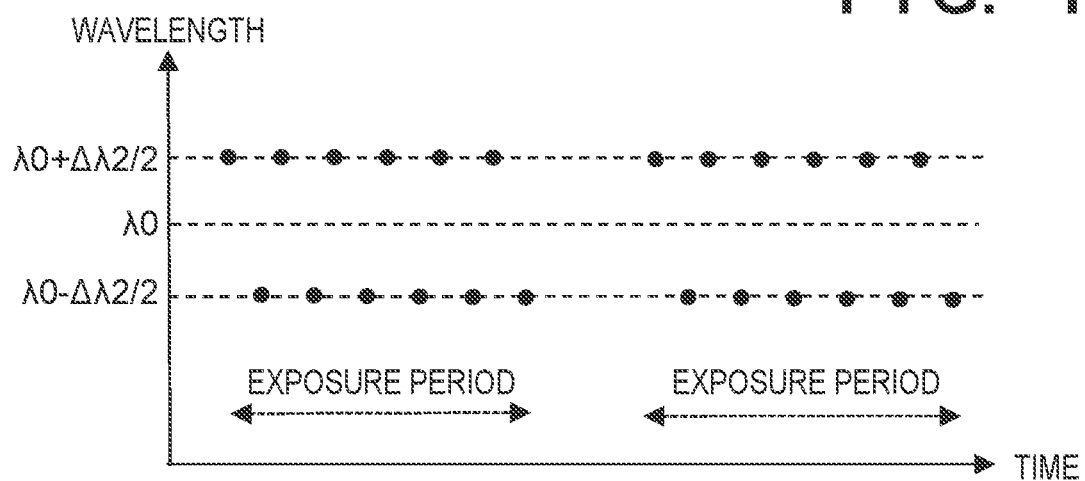
FIG. 19 is a view for explaining an exposure method according to the sixth embodiment.

With reference to FIG. 19, FLEX exposure in an exposure apparatus EXP according to the sixth embodiment will be described. The exposure apparatus EXP according to the sixth embodiment can have an arrangement similar to that of the exposure apparatus EXP according to the fourth embodiment shown in FIG. 16. In the sixth embodiment, the center wavelength of exposure light generated by a light source 41 is changed in a manner different from that in the fourth embodiment. In FIG. 19, the abscissa represents time, and the ordinate represents the center wavelength of exposure light generated by the light source 41. As exposure light generated by the light source 41, light beams having two center wavelengths of λ0+Δλ2/2 and λ0−λ2/2, respectively, are used alternately. λ0 is the center wavelength of exposure light generated by the light source 41 when no FLEX exposure is performed. Δλ2 is the difference between the two center wavelengths for obtaining the effect similar to that in the FLEX exposure in which the FLEX amount is set to the distance Z2 as described in the third embodiment.

Letting C be the axial chromatic aberration of a projection optical system 4, the wavelength difference Δλ2 can be given by equation (5) obtained from equation (3):

$$\Delta\lambda 2 = Z2/C = \lambda 0/[(1-\lambda 0^2/P^2/4)^{1/2} - (1-9\times\lambda 0^2/P^2/4)^{1/2}]/2/C \qquad (5)$$

In the example shown in FIG. 19, the exposure light beams having the two wavelengths are oscillated alternately for each pulse. However, in a step-and-repeat exposure apparatus, a substrate may be exposed while changing the wavelength between the first half and the second half of exposure.

Figure 20:
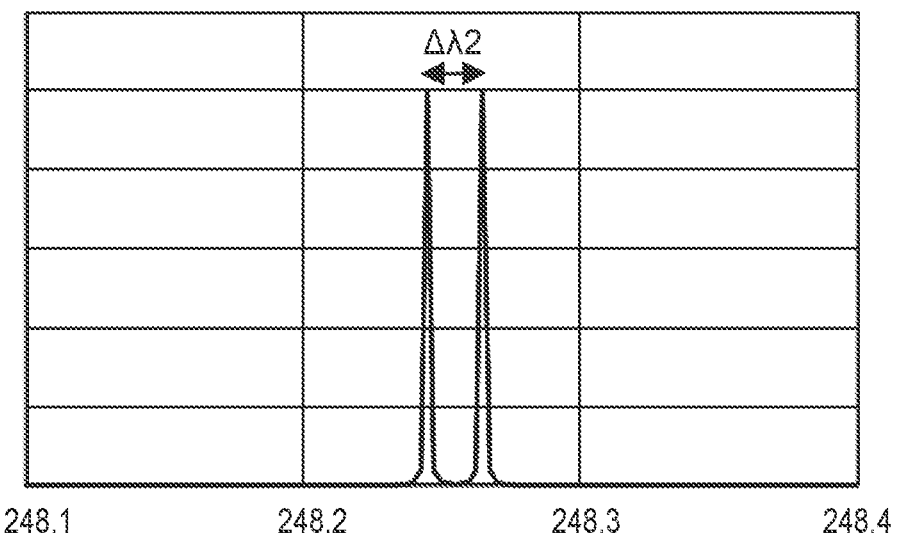
FIG. 20 is a view for explaining the exposure method according to the sixth embodiment.

FIG. 20 shows a modification of the sixth embodiment. In the method described with reference to FIG. 19, the light source 41 alternately generates the exposure light beams having the two center wavelengths of $\lambda 0+\Delta\lambda 2/2$ and $\lambda 0-\Delta\lambda 2/2$. However, as shown in FIG. 20, the exposure light beams having the two center wavelengths may be simultaneously generated. The interval between the two center wavelengths is $\Delta\lambda 2$, and the center between the two center wavelengths is $\lambda 0$.

In each of the first to third embodiments, FLEX exposure is implemented by driving a substrate such that each point in a shot region of the substrate is exposed in two or more focus states (or, two or more defocus states). In each of the fourth to sixth embodiments, FLEX exposure is implemented by changing the wavelength of exposure light such that each point in a shot region of a substrate is exposed in two or more focus states (or, two or more defocus states). In the seventh embodiment, a controller CN performs an operation of driving a substrate and an operation of changing the wavelength of exposure light such that each point in a shot region of the substrate is exposed in two or more defocus states (or, two or more defocus states).

The operation of driving a substrate can include an operation of continuously changing the position of the substrate. Alternatively, the operation of driving a substrate can include an operation of changing the first focus state (or, the first defocus state) to the second focus state (or, the second defocus state) to perform exposure in the second focus state (second defocus state) after exposure in the first focus state (first defocus state).

The controller CN may perform a first operation and a second operation on one shot region such that each point in a shot region of the substrate is exposed in two or more focus states (or, two or more defocus states). The first operation can be an operation of exposing a shot region while setting the position of a substrate 7 in the optical axis direction of a projection optical system 4 to a first position and setting the wavelength of exposure light to a first wavelength. The second operation can be an operation of exposing the shot region while setting the position of the substrate 7 in the optical axis direction of the projection optical system 4 to a second position different from the first position and setting the wavelength of the exposure light to a second wavelength different from the first wavelength.

In the method of changing the center wavelength of a light source 41, the change amount of the center wavelength between pulses is $\Delta\lambda$. Since the oscillation frequency of currently the mainstream excimer laser is 4 KHz, the pulse interval is 0.25 msec. The wavelength that can be changed during 0.25 msec while maintaining the accuracy of the center wavelength is limited.

Figure 21A:
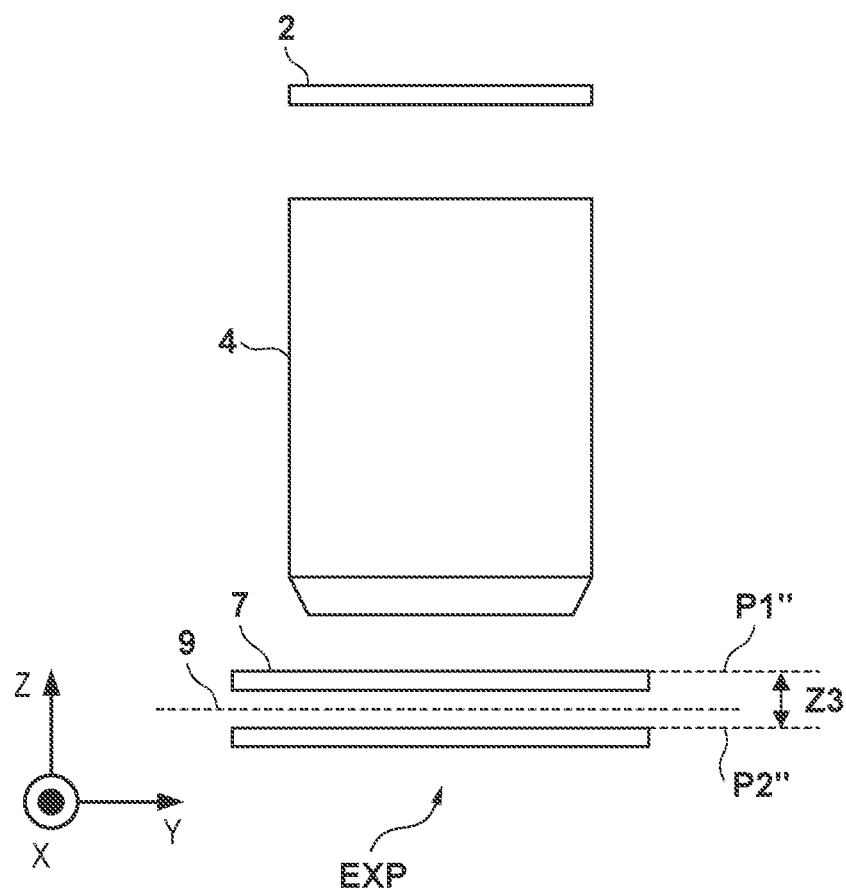
FIG. 21A is a view showing the arrangement of an exposure apparatus according to the seventh embodiment.
Figure 21B:
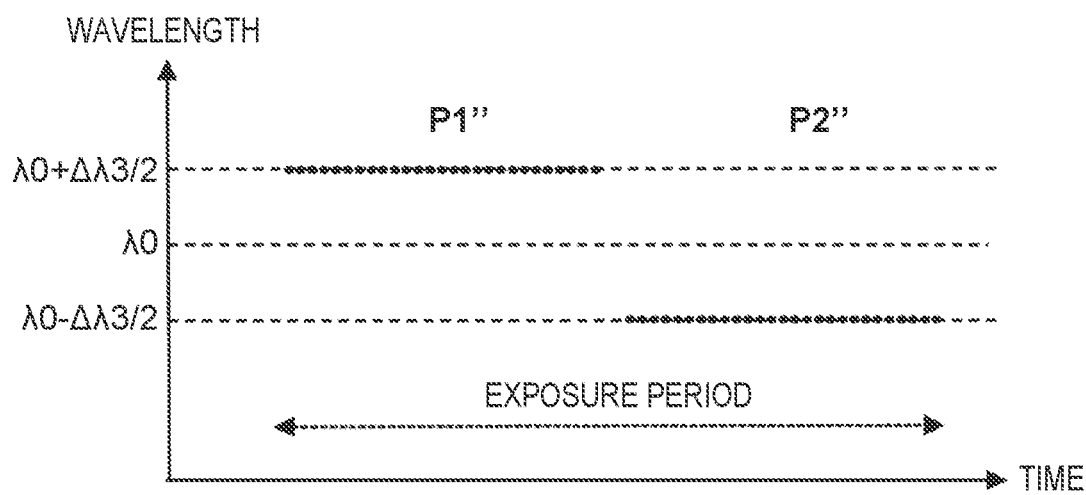
FIG. 21B is a view for explaining an exposure method according to the seventh embodiment.

With reference to FIGS. 21A and 21B, the seventh embodiment will be described. FIG. 21A schematically shows the driving amount (distance Z3) of the substrate 7 in a FLEX method performed by an exposure apparatus EXP according to the seventh embodiment. FIG. 21B shows the change amount ($\Delta\lambda 3$) of the wavelength of exposure light in the FLEX method performed by the exposure apparatus EXP according to the seventh embodiment. The condition for maximizing the depth of focus upon exposing the substrate 7 at two positions (a first position P1" and a second position P2") in the optical axis direction can be given by equation (3). The condition for maximizing the depth of focus upon exposing the substrate 7 with two wavelengths can be given by equation (5). If the maximum change amount of the wavelength of exposure light in the FLEX method is $\Delta\lambda 3$ where $\Delta\lambda 3 < Z2/C$, the depth of focus cannot be maximized.

When the projection optical system 4 is a refractive system, due to the axial chromatic aberration, the image plane moves in the −Z-axis direction for a long wavelength (that is, $\lambda 0+\Delta\lambda 3/2$), and the image plane moves to the +Z-axis direction for a short wavelength (that is, $\lambda 0-\Delta\lambda 3/2$). In order to increase the moving amount of the image plane from the substrate 7, it is advantageous to set the wavelength to $\lambda 0+\Delta\lambda 3/2$ at the first position P1" close to the projection optical system 4, and set the wavelength to $\lambda 0-\Delta\lambda 3/2$ at the second position P2" far from the projection optical system 4. In this case, letting C be the value of the axial chromatic aberration of the projection optical system 4, the depth of focus can be maximized when equation (6) is satisfied:

$$Z3 + \Delta\lambda 3 \times C = Z2 \qquad (6)$$

In each of the above-described embodiments, when the FLEX exposure is performed on one shot region in a predetermined defocus range, the predetermined defocus range may be divided into a plurality of small ranges and the FLEX exposure may be performed for each small range.

(Manufacturing Method of Article)

A method of manufacturing a semiconductor apparatus (a photoelectric conversion apparatus such as a memory or an image sensor) using the representative exposure apparatus according to this embodiment will be described. The exposure apparatus according to this embodiment is preferably used in a semiconductor apparatus manufacturing method including a thick film process. The thick film process is a process in which a thick resist film is required. As an example of the thick film process is a formation step of a pixel separation portion in an image sensor (photoelectric conversion apparatus).

Figure 23A:
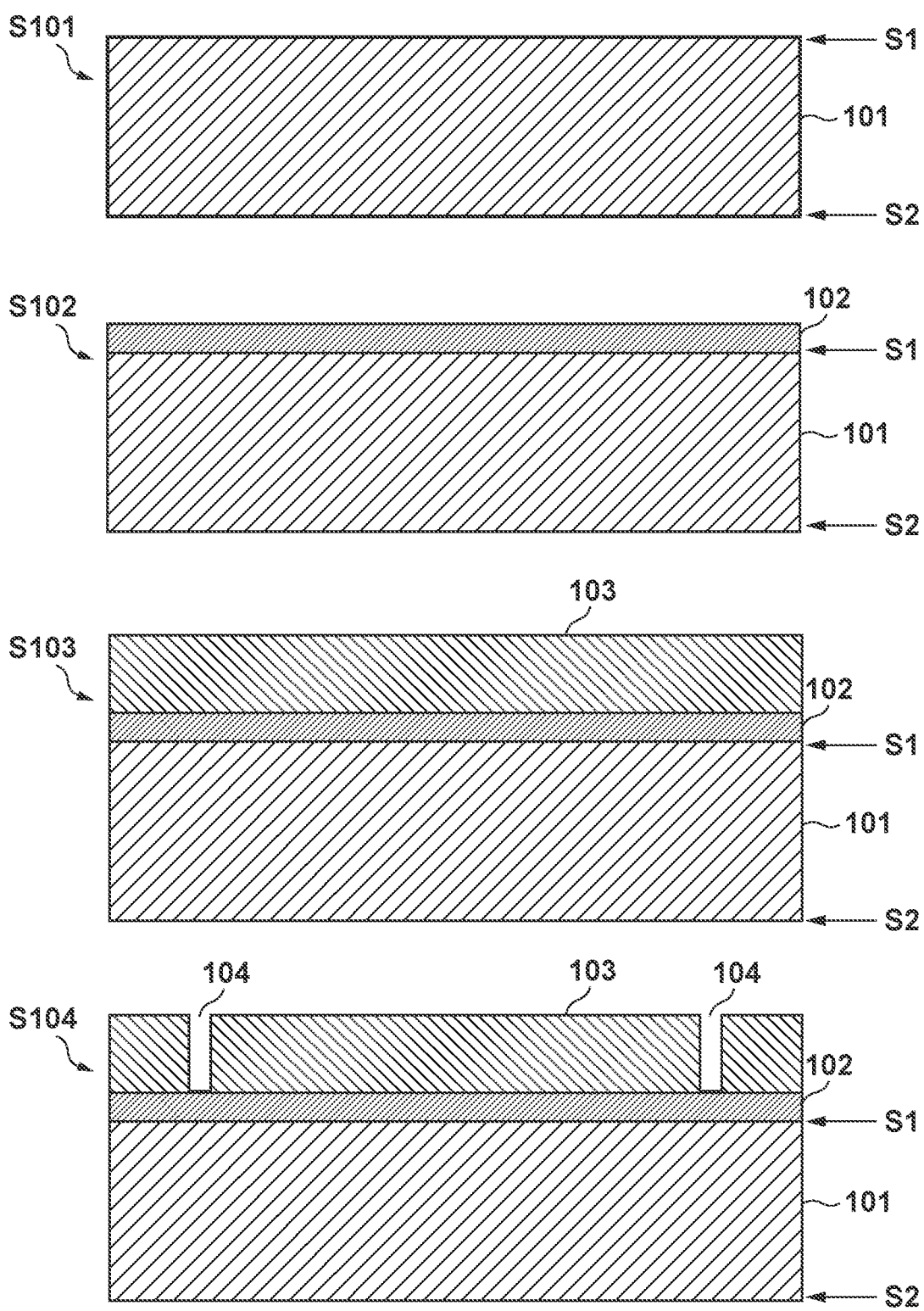
FIGS. 23A to 23C are views exemplarily showing manufacturing steps of an image sensor.
Figure 23B:
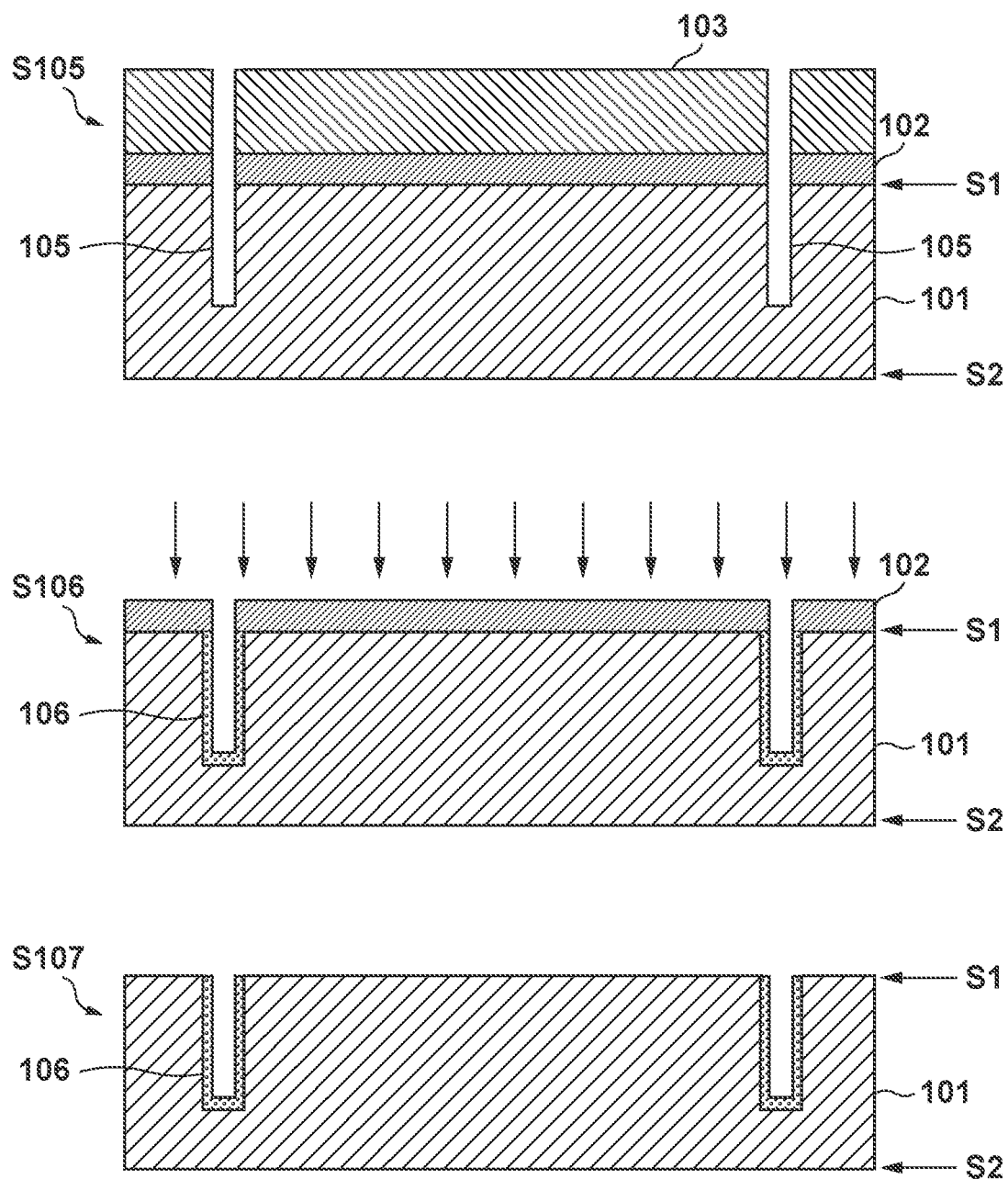
Figure 23C:
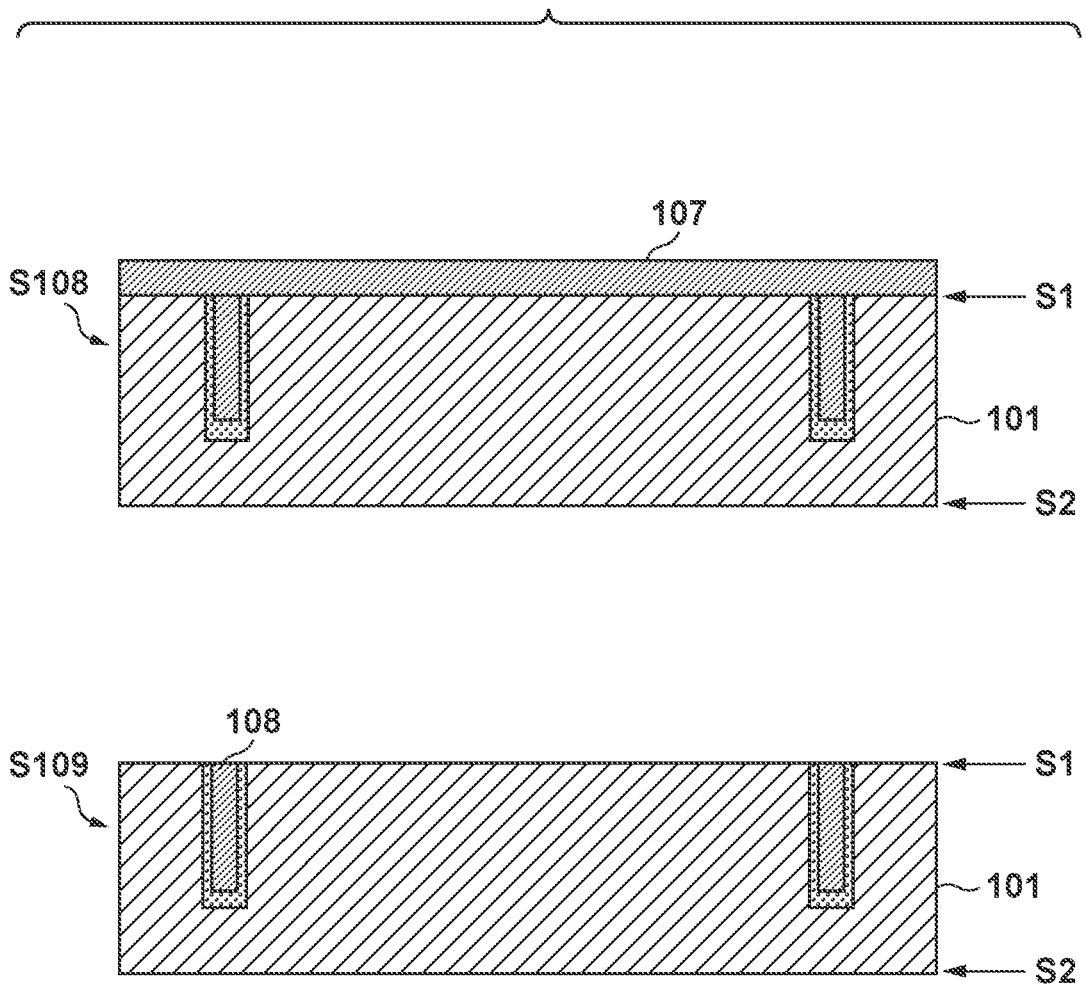

The formation steps of a pixel separation portion in the manufacturing steps of an image sensor will be described with reference to FIGS. 23A to 23C. In step S101, a semiconductor substrate 101 having a first face S1 and a second face S2 which are opposing faces is prepared. The semiconductor substrate 101 is typically a silicon substrate or a silicon layer. Next, in step S102, an insulating film (for example, a silicon oxide film) 102 is formed on the first face S1 of the semiconductor substrate 101.

Next, in step S103, a resist 103 is applied on the first face S1 of the semiconductor substrate 101, more specifically on the insulating film 102 on the first face S1 of the semiconductor substrate 101. Further, in step S104, as has been described in the above-described embodiment, an exposure operation is performed such that, in a state in which a predetermined light intensity distribution is formed in the pupil plane of the projection optical system, each point in a shot region of the semiconductor substrate 101 is exposed in two or more focus states (or, two or more defocus states). With this, a pattern image is formed in the resist 103, and a groove (trench) 104 is formed via etching processing or the like. By performing the exposure operation in a state in which the depth of focus is increased, it is possible to form, in the resist 103, a pattern image having a desired shape.

Next, in step S105, the semiconductor substrate 101 is etched by a dry etching method or the like, thereby forming a groove 105 on the first face S1 side of the semiconductor substrate 101. In order to protect the first face S1 of the semiconductor substrate 101 in this etching, it is necessary to apply the thick resist 103.

Then, in step S106, the resist 103 is removed, and ions are implanted into the semiconductor substrate 101 through the groove 105, thereby forming a gettering region 106. That is, in step S106, ions are implanted into the semiconductor substrate 101 through the groove 105 in a state in which a region other than a region having the groove 105 out of the first face S1 of the semiconductor substrate 101 is masked by the insulating film 102. The gettering region 106 can include a first portion positioned below the bottom of the groove 105 and a second portion positioned on the lateral side of the groove 105. As an example, the group 14 element concentration in the first portion is higher than that in the second portion. If the semiconductor substrate 101 is a silicon substrate, the ions can be the group 14 element ions other than silicon. An ion implantation apparatus can be used for implanting ions. An acceleration energy for implanting the ions can be determined such that the ions are not implanted through the insulating film 102 serving as the hard mask and does not reach the semiconductor substrate 101. For example, if the thickness of the insulating film 102 is 300 nm and the acceleration energy is about 20 keV in implanting the ions, the ions are not implanted through the insulating film 102.

If the semiconductor substrate 101 is made of a silicon substrate, a material that forms ions to be implanted into the semiconductor substrate 101 in step S106 is preferably carbon. A hydrocarbon molecule containing carbon may be employed. If the semiconductor substrate 101 is made of the silicon substrate, a material that forms ions to be implanted into the semiconductor substrate 101 in step S106 can be germanium, tin, or zinc. If carbon, germanium, tin, or zinc ions are implanted in the silicon substrate serving as the semiconductor substrate 101, a local strain is given to the silicon substrate and this local region functions as a gettering site. By implanting the ions into the semiconductor substrate 101 through the groove 105, the gettering region 106 can be formed at a deep position of the semiconductor substrate 101 even with a relatively low acceleration energy.

Next, in step S107, the insulating film 102 is removed. In step S108, an insulating film (for example, a silicon nitride film) 107 is formed in the groove 105 and on the first face S1 of the semiconductor substrate 101 by a film formation method such as a reduced pressure CVD method so as to arrange or fill the insulator in the groove 105. Subsequently, in step S109, a portion of the insulating film 107 which exits on the first face S1 of the semiconductor substrate 101 is removed by a CMP method or the like. Accordingly, a portion of the insulating film 107 which exists in the groove 105 is left as a pixel separation portion 108 arranged or filled in the groove 105.

Note that steps S108 and S109 need not be performed. If steps S108 and S109 are not performed, the groove 105 is left as an air gap which can function as the pixel separation portion. The pixel separation portion 108 arranged in the groove 105 need not be perfectly filled in the groove 105, and an air gap may exist in the groove 105. The pixel separation portion 108 can be formed from only an insulator, but can be formed by a combination of an insulator and a non-insulator (a semiconductor or conductor). In this case, in order to avoid the contact between the non-insulator and the semiconductor substrate 101, the insulator can be arranged between the non-insulator and the semiconductor substrate 101.

As has been described above, via the first formation step of forming the groove 105 in the semiconductor substrate 101 and the second formation step of forming the pixel separation portion 108 in the groove 105, the pixel separation portion 108 is formed. Thereafter, a charge accumulation region, a gate electrode, and the like are formed in a region between a plurality of pixel separation portions, thereby forming an image sensor. The method of manufacturing an article according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-147085, filed Sep. 1, 2020 and Japanese Patent Application No. 2021-138254, filed Aug. 26, 2021, which are hereby incorporated by reference herein in their entirety.

What is claimed is:

1. An exposure apparatus that comprises an illumination optical system configured to illuminate an original including a periodic pattern and a projection optical system configured to form an image of the original on a substrate, the exposure apparatus further comprising:

a controller configured to:
cause light from the illumination optical system to be obliquely incident on the original such that a light intensity distribution:
includes four high light intensity portions,
is line-symmetric with respect to a straight line that:
passes through an origin of a pupil region of the projection optical system, and
is orthogonal to a periodic direction of the periodic pattern, and
is formed in the pupil region of the projection optical system by a plurality of diffracted light beams including diffracted light of lower than 2nd-order and diffracted light of not lower than the 2nd-order from the periodic pattern; and control exposure of the substrate such that each point in a shot region of the substrate is exposed in not less than two focus states based on a relationship between focus states and phase differences of two lights among four lights from the four high light intensity portions, wherein a phase difference between the two lights periodically changes in accordance with a focus state.

2. The apparatus according to claim 1, further comprising an adjuster configured to adjust the illumination optical system such that the light intensity distribution is formed in the pupil region of the projection optical system.

3. The apparatus according to claim 2, wherein the adjuster adjusts the illumination optical system such that the light intensity distribution formed in the pupil region of the projection optical system includes a pole arranged on the straight line.

4. The apparatus according to claim 2, wherein:
the adjuster adjusts the illumination optical system such that a second light intensity distribution, including at least two second high light intensity portions, arranged line-symmetrically with respect to a line parallel to a direction orthogonal to the periodic direction and spaced apart from each other are formed in a pupil region of the illumination optical system, and
each of the at least two second high light intensity portions has a higher light intensity than in the remaining portion in the second light intensity distribution.

5. The apparatus according to claim 4, wherein the adjuster adjusts the illumination optical system such that a σ value of a center position of each of the at least two second high light intensity portions included in the light intensity distribution formed in the pupil region of the illumination optical system is not more than r/3, where r is a radius of the pupil region of the illumination optical system.

6. The apparatus according to claim 4, wherein a ratio of light amounts of the at least two second high light intensity portions in the pupil region of the illumination optical system to a light amount of the entire light intensity distribution formed in the pupil region of the illumination optical system is not lower than 50%.

7. The apparatus according to claim 1, wherein a value obtained by converting, into a σ value, a width, in the periodic direction, of each of the at least two high light intensity portions included in the light intensity distribution formed in the pupil region of the projection optical system is not larger than 0.3.

8. The apparatus according to claim 1, wherein the controller controls exposure of the substrate such that scanning exposure of the substrate is performed in a state where a normal direction of a surface of the substrate is tilted with respect to an optical axis direction of the projection optical system.

9. The apparatus according to claim 1, wherein the controller controls exposure of the substrate such that the shot region is exposed in each of a first focus state and a second focus state.

10. The apparatus according to claim 1, wherein the controller performs an operation of driving the substrate and an operation of changing a wavelength of exposure light such that each point in the shot region of the substrate is exposed in not less than two focus states.

11. The apparatus according to claim 10, wherein the operation of driving the substrate includes an operation of continuously changing a position of the substrate.

12. The apparatus according to claim 1, wherein the controller performs an operation of exposing the shot region while setting a position of the substrate in an optical axis direction of the projection optical system to a first position and setting a wavelength of exposure light to a first wavelength, and an operation of exposing the shot region while setting the position of the substrate in the optical axis direction of the projection optical system to a second position different from the first position and setting the wavelength of the exposure light to a second wavelength different from the first wavelength, such that each point in the shot region is exposed in not less than two focus states.

13. An exposure apparatus that comprises an illumination optical system configured to illuminate an original including a periodic pattern and a projection optical system configured to form an image of the original on a substrate, the exposure apparatus further comprising:
a controller configured to:
cause light from the illumination optical system to be obliquely incident on the original such that a light intensity distribution:
includes at least two high light intensity portions, each having a higher light intensity than in a remaining portion,
is line-symmetric with respect to a straight line that:
passes through an origin of a pupil region of the projection optical system, and
is orthogonal to a periodic direction of the periodic pattern, and
is formed in the pupil region by a plurality of diffracted light beams including diffracted light of not lower than the 2nd-order from the periodic pattern; and
control exposure of the substrate such that each point in a shot region of the substrate is exposed in not less than two focus states,
wherein the illumination optical system allows the plurality of diffracted light beams to form the light intensity distribution including the at least two high light intensity portions in the pupil region by satisfying $P > (3/2) \times (\lambda/NA)$
where P is a pitch of the periodic pattern in the periodic direction, $\lambda$ is a wavelength of exposure light, and NA is a numerical aperture of the projection optical system.

14. An exposure apparatus that comprises an illumination optical system configured to illuminate an original including a periodic pattern and a projection optical system configured to form an image of the original on a substrate, the exposure apparatus further comprising:
a controller configured to:
cause light from the illumination optical system to be obliquely incident on the original such that a light intensity distribution is:
line-symmetric with respect to a straight line that:
passes through an origin of a pupil region of the projection optical system, and
is orthogonal to a periodic direction of the periodic pattern, and
formed in the pupil region by a plurality of diffracted light beams including diffracted light of not lower than the 2nd-order from the periodic pattern; and
control exposure of the substrate such that:
each point in a shot region of the substrate is exposed in not less than two focus states, and
scanning exposure of the substrate is performed in a state where a normal direction of a surface of the substrate is tilted with respect to an optical axis direction of the projection optical system, wherein in the scanning exposure, the shot region is exposed such that an arbitrary point in the shot region reaches a second focus state from a first focus state, and $Z1=\lambda/[(1-\lambda^2/P^2/4)^{1/2}-(1-9\times\lambda^2/P^2/4)^{1/2}]$ is satisfied, where Z1 is a distance in the optical axis direction between the arbitrary point in the first focus state and the arbitrary point in the second focus state, P is a pitch of the periodic pattern in the periodic direction, and $\lambda$ is a wavelength of exposure light.

15. An exposure apparatus that comprises an illumination optical system configured to illuminate an original including a periodic pattern and a projection optical system configured to form an image of the original on a substrate, the exposure apparatus further comprising:

a controller configured to:
cause light from the illumination optical system to be obliquely incident on the original such that a light intensity distribution is:
line-symmetric with respect to a straight line that:
passes through an origin of a pupil region of the projection optical system, and
is orthogonal to a periodic direction of the periodic pattern, and
formed in the pupil region by a plurality of diffracted light beams including diffracted light of not lower than the 2nd-order from the periodic pattern; and
control exposure of the substrate such that:
each point in a shot region of the substrate is exposed in not less than two focus states; and
the shot region is exposed in each of a first focus state and a second focus state,
wherein $Z2=\lambda/[(1-\lambda^2/P^2/4)^{1/2}-(1-9\times\lambda^2/P^2/4)^{1/2}]/2$ is satisfied,
where Z2 is a distance between a position of the substrate in the first focus state in an optical axis direction of the projection optical system and a position of the substrate in the second focus state in the optical axis direction, P is a pitch of the periodic pattern in the periodic direction, and $\lambda$ is a wavelength of exposure light.

16. An exposure apparatus that comprises an illumination optical system configured to illuminate an original including a periodic pattern and a projection optical system configured to form an image of the original on a substrate, the exposure apparatus further comprising:

a controller configured to:
cause light from the illumination optical system to be obliquely incident on the original such that a light intensity distribution is:
line-symmetric with respect to a straight line that:
passes through an origin of a pupil region of the projection optical system, and
is orthogonal to a periodic direction of the periodic pattern, and
formed in the pupil region by a plurality of diffracted light beams including diffracted light of not lower than the 2nd-order from the periodic pattern; and
control exposure of the substrate such that each point in a shot region of the substrate is exposed in not less than two focus states,
wherein $\Delta\lambda=\lambda0/[(1-\lambda0^2/P^2/4)^{1/2}-(1-9\times\lambda0^2/P^2/4)^{1/2}]/C$ is satisfied,
where C is a value of an axial chromatic aberration of the projection optical system, P is a pitch of the periodic pattern in the periodic direction, $\Delta\lambda$ is a full width at half maximum of exposure light, and $\lambda0$ is a peak of the exposure light.

17. The apparatus according to claim 16, wherein;
a center wavelength of exposure light is continuously changed between two wavelengths, and
the $\Delta\lambda=\lambda0/[(1-\lambda0^2/P^2/4)^{1/2}-(1-9\times\lambda0^2/P^2/4)^{1/2}]/C$ is satisfied in a state where the two wavelengths are $\lambda0-\Delta\lambda/2$ and $\lambda0+\Delta\lambda/2$.

18. The apparatus according to claim 16, wherein;
exposure light beams having two wavelengths whose center wavelengths are different from each other are used, and
the $\Delta\lambda=\lambda0/[(1-\lambda0^2/P^2/4)^{1/2}-(1-9\times\lambda0^2/P^2/4)^{1/2}]/C$ is satisfied in a state where the two wavelengths are $\lambda0-\Delta\lambda/2$ and $\lambda0+\Delta\lambda/2$.

19. An exposure method of exposing a substrate using an illumination optical system configured to illuminate an original including a periodic pattern and a projection optical system configured to form an image of the original on the substrate, the method comprising:

causing light from the illumination optical system to be obliquely incident on the original such that a light intensity distribution:
includes four high light intensity portions,
is line-symmetric with respect to a straight line that:
passes through an origin of a pupil region of the projection optical system, and
is orthogonal to a periodic direction of the periodic pattern, and
is formed in the pupil region by a plurality of diffracted light beams including diffracted light of lower than 2nd-order and diffracted light of not lower than the 2nd-order from the periodic pattern; and
controlling exposure of the substrate such that each point in a shot region of the substrate is exposed in not less than two focus states based on a relationship between focus states and phase differences of two lights among four lights from the four high light intensity portions,
wherein a phase difference between the two lights periodically changes in accordance with a focus state.

20. A method of manufacturing a semiconductor apparatus, the method comprising:
forming a groove in a substrate and forming a pixel separation portion in the groove,
wherein the forming of the groove includes an operation of exposing the substrate in accordance with the exposure method according to claim 19.

21. A method of manufacturing a semiconductor apparatus, the method comprising:
forming a groove in a substrate and forming a pixel separation portion in the groove;
forming a light intensity distribution that:
includes four high light intensity portions, each having a higher light intensity than in a remaining portion,
is arranged line-symmetrically with respect to a straight line that:
passes through an origin of a pupil region of a projection optical system configured to form an image of an original having a periodic pattern on the substrate, and
is orthogonal to a periodic direction of the periodic pattern, and
is formed in the pupil region by a plurality of diffracted light beams including diffracted light of lower than 2nd-order and diffracted light of not lower than the 2nd-order from the periodic pattern; and exposing the substrate such that each point in a shot region of the substrate is exposed in not less than two focus states based on a relationship between focus states and phase differences of two lights among four lights from the four high light intensity portions,
wherein a phase difference between the two lights periodically changes in accordance with a focus state.

* * * * *